US011804252B2

(12) United States Patent
Russell et al.

(10) Patent No.: US 11,804,252 B2
(45) Date of Patent: Oct. 31, 2023

(54) WORD LINE STRUCTURES FOR THREE-DIMENSIONAL MEMORY ARRAYS

(71) Applicant: Micron Technology, Inc., Boise, ID (US)

(72) Inventors: Stephen W. Russell, Boise, ID (US); Lorenzo Fratin, Buccinasco (IT); Enrico Varesi, Milan (IT); Paolo Fantini, Vimercate (IT)

(73) Assignee: Micron Technology, Inc., Boise, ID (US)

(*) Notice: Subject to any disclaimer, the term of this patent is extended or adjusted under 35 U.S.C. 154(b) by 35 days.

(21) Appl. No.: 17/656,283

(22) Filed: Mar. 24, 2022

(65) Prior Publication Data
US 2023/0307025 A1  Sep. 28, 2023

(51) Int. Cl.
*G11C 8/00* (2006.01)
*G11C 8/10* (2006.01)
(Continued)

(52) U.S. Cl.
CPC .................. *G11C 8/10* (2013.01); *G11C 8/14* (2013.01); *H01L 23/5226* (2013.01);
(Continued)

(58) Field of Classification Search
CPC ... G11C 13/004; G11C 5/025; G11C 16/0483; G11C 2213/71; G11C 13/0004; G11C 13/0023; G11C 16/26; G11C 13/0002; G11C 16/08; G11C 13/0026; G11C 13/0069; G11C 13/0097; G11C 16/10; G11C 7/12; G11C 11/2253; G11C 11/2259; G11C 13/0021; G11C 13/0028; G11C 2213/79; G11C 7/062; G11C 8/10; G11C 11/5635; G11C 16/16; G11C 16/24; G11C 16/3445; G11C 16/3459; G11C 2213/34; G11C 2213/75; G11C 11/4094; G11C 16/0466; G11C 7/18; G11C 8/08; G11C 11/5642; G11C 11/5671; G11C 13/0007; G11C 13/003; G11C 16/30; G11C 16/32; G11C 16/3409; G11C 16/3418; G11C 16/3431; G11C 2213/77; G11C 29/028; G11C 29/76; G11C 7/00; G11C 11/5621;
(Continued)

(56) References Cited

U.S. PATENT DOCUMENTS 10,943,952 B2 * 3/2021 Nardi ..................... H10N 70/20

* cited by examiner

*Primary Examiner* — Thong Q Le
(74) *Attorney, Agent, or Firm* — Holland & Hart LLP

(57) ABSTRACT

Methods, systems, and devices for word line structures for three-dimensional memory arrays are described. A memory device may include word line structures that support accessing memory cells arranged in a three-dimensional level architecture. The word line structures may be arranged above a substrate and be separated from each other by respective dielectric layers. Each word line structure may include word line members and a word line plate that is connected to each word line member. Each word line plate may include a contact that may be coupled with a word line decoder operable to bias the word line plate. To couple the word line plate to the word line decoder, the memory device may include first vias that extend through holes in the word line plates and are coupled with second vias that extend from a respective contact through openings in the word line plates above the contact.

25 Claims, 21 Drawing Sheets

(51) Int. Cl.
   *G11C 8/14* (2006.01)
   *H01L 23/522* (2006.01)
   *H10B 63/00* (2023.01)
   *H10N 70/00* (2023.01)

(52) U.S. Cl.
   CPC ........... *H10B 63/84* (2023.02); *H10N 70/021* (2023.02); *H10N 70/826* (2023.02)

(58) Field of Classification Search
   CPC .............. G11C 13/0033; G11C 13/025; G11C 16/0408; G11C 16/0458; G11C 17/16; G11C 2029/0411; G11C 2029/1202; G11C 2029/1204; G11C 29/025; G11C 29/44; G11C 29/88; G11C 7/04; G11C 13/0038; G11C 16/04; G11C 29/021; G11C 5/06; G11C 8/12; H01L 27/0207; H01L 23/528; H01L 21/76877; H10N 70/20; H10N 70/231; H10N 70/253; H10N 70/826; H10N 70/8613; H10N 70/882; H10N 70/8825; H10N 70/8828; H10N 70/883; H10B 63/24; H10B 63/845; H10B 63/34; H10B 43/27; H10B 41/27; H10B 43/10; G06F 12/0238; G06F 3/06

See application file for complete search history.

| | | | | | |
|---|---|---|---|---|---|
| L90 | L89 | L46 | L45 | L2 | L1 |
| L92 | L91 | L48 | L47 | L4 | L3 |
| L94 | L93 | L50 | L49 | L6 | L5 |
| L96 | L95 | L52 | L51 | L8 | L7 |
| L98 | L97 | L54 | L53 | L10 | L9 |
| L100 | L99 | L56 | L55 | L12 | L11 |
| L102 | L101 | L58 | L57 | L14 | L13 |
| L104 | L103 | L60 | L59 | L16 | L15 |
| L106 | L105 | L62 | L61 | L18 | L17 |
| L108 | L107 | L64 | L63 | L20 | L19 |
| L110 | L109 | L66 | L65 | L22 | L21 |
| L132 | L131 | L88 | L87 | L44 | L43 |
| L130 | L129 | L86 | L85 | L42 | L41 |
| L128 | L127 | L84 | L83 | L40 | L39 |
| L126 | L125 | L82 | L81 | L38 | L37 |
| L124 | L123 | L80 | L79 | L36 | L35 |
| L122 | L121 | L78 | L77 | L34 | L33 |
| L120 | L119 | L76 | L75 | L32 | L31 |
| L118 | L117 | L74 | L73 | L30 | L29 |
| L116 | L115 | L72 | L71 | L28 | L27 |
| L114 | L113 | L70 | L69 | L26 | L25 |
| L112 | L111 | L68 | L67 | L24 | L23 |

810-a: rows L90–L110 block (top)
810-b: rows L132–L112 block (bottom)
805-c, 805-b, 805-a: column groupings (left to right)

WORD LINE STRUCTURES FOR THREE-DIMENSIONAL MEMORY ARRAYS

FIELD OF TECHNOLOGY

The following relates to one or more systems for memory, including word line structures for three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 8 illustrates an example of a staircase diagram that supports word line structures for three-dimensional memory arrays in accordance with examples as disclosed herein.

DETAILED DESCRIPTION

Figure 1:
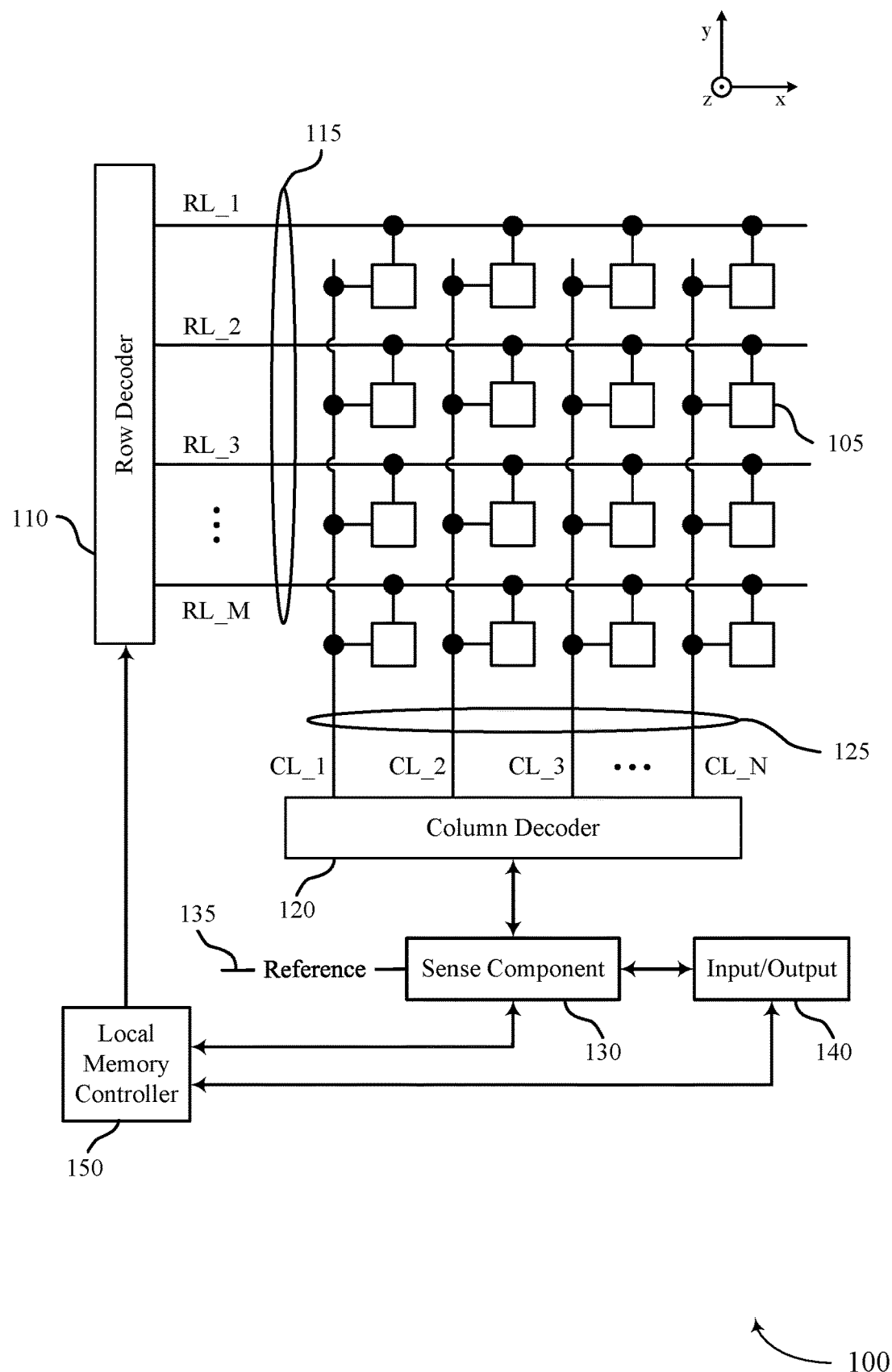
FIG. 1 illustrates an example of a memory array that supports word line structures for three-dimensional memory arrays in accordance with examples as disclosed herein.

In some memory architectures, a memory device may include a memory array arranged in a three-dimensional architecture that includes memory cells arranged according to different levels (e.g., layers, decks, planes, tiers). In some such architectures, a memory cell may be coupled with (e.g., coupled physically between, electrically between, or both) a word line and a conductive pillar that extends through the levels of the memory array. The memory device may include circuitry that supports the biasing of word lines and conductive pillars such that memory cells of the memory array may be accessed (e.g., logic states may be read from and/or written to the memory cells based on the biasing of respective word lines and conductive pillars).

In accordance with examples as disclosed herein, a memory device may include word line structures that support (e.g., enable) word line biasing and word line decoding such that memory cells of the memory device that are arranged in a three-dimensional architecture may be accessed. For example, the memory device may include word line structures that are arranged above a substrate (e.g., vertically above the substrate, along a direction normal to the substrate) and separated from each other by respective dielectric layers. Each word line structure may include word line members (e.g., individual word lines) that each extend in a first direction (e.g., horizontal to the substrate) and into a memory region of the memory device. The memory region may correspond to a region of the memory device where the memory cells are located, and each memory cell may be coupled with a word line member of a word line structure. Each word line structure may also include a word line plate (e.g., located in a word line plate region that is adjacent to the memory region) that extends in the first direction and a second direction orthogonal to the first direction and is connected to each of the word line members. Each word line plate may include a contact that is operable to couple the word line plate with a respective word line decoder. A word line decoder (e.g., a word line driver) may be operable to bias a word line plate to various voltages, which may cause respective word line members to be biased to the various voltages, thereby applying the various voltages to corresponding memory cells (e.g., to word line terminals of the corresponding memory cells).

The memory device may include vias (e.g., conductive vias) that couple the word line plates to corresponding word line decoders, such that biasing of the word line plates may be supported. For example, the memory device may include first vias that extend (e.g., vertically) through holes in the word line plates and are each coupled with a word line decoder. The memory device may also include second vias that each extend from a contact of a word line plate (e.g., vertically) through openings in each of the word line plates that are above the word line plate. The second vias may each be coupled with a first via such that biasing a word line decoder may bias a word line plate by biasing a first via. In some examples, the memory device may include pillars arranged in columns extending in the second direction, the pillars extending through the word line plates and supporting the formation of the word line structures. For example, the pillars may be formed in cavities through which materials that form the word line structures may be deposited at each respective layer. The pillars may fill the cavities and provide mechanical support for the memory device. By implementing such word line structures and associated circuitry, a memory device may support word line biasing in accordance with access operations for memory cells arranged in a three-dimensional level architecture.

Features of the disclosure are initially described in the context of memory devices and arrays with reference to FIGS. 1, 2, 3A, and 3B. Features of the disclosure are described in the context of example layouts, a staircase diagram, and manufacturing operations with reference to FIGS. 4-20. These and other features of the disclosure are further illustrated by and described with reference to a flowchart that relates to word line structures for three-dimensional memory arrays as described with reference to FIG. 21.

FIG. 1 illustrates an example of a memory device 100 that supports word line structures for three-dimensional memory arrays in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

In some examples of the memory device 100, the memory cells 105 may be arranged in a three-dimensional architecture according to different levels (e.g., along the illustrative z-direction). In some such architectures, a memory cell 105 may be coupled between a word line and a conductive pillar that extends through the levels of memory cells 105. To access the memory cell 105, circuitry (e.g., a row decoder 110, a column decoder 120, or another type of decoder) may be configured to bias the word line and the conductive pillar to respective voltages such that a bias is applied across the memory cell 105.

In accordance with examples as disclosed herein, the memory device 100 may include word line structures that enable the biasing of word lines coupled with memory cells 105 arranged in a three-dimensional architecture. For example, the memory device 100 may include word line structures that are arranged above a substrate of the memory device 100 and are operable to be coupled with a word line decoder (e.g., a row decoder 110). Each word line structure may include word line members that each extend in a first direction and into a memory region of the memory device 100. The memory region may correspond to a region of the memory device 100 where the memory cells 105 are located, and each memory cell 105 may be coupled with a word line member of a word line structure. Each word line structure may also include a word line plate (e.g., located in a word line plate region that is adjacent to the memory region) that extends in the first direction and a second direction orthogonal to the first direction and is connected to each of the word line members. Each word line plate may include a contact that is operable to couple the word line plate with a respective word line decoder, for example, by respective vias that extend through holes and openings in the word line plates. Accordingly, the word line structures and associated circuitry may support the accessing, by word line decoders, of memory cells 105 arranged in a three-dimensional level architecture.

The memory device 100 may include any quantity of non-transitory computer readable media that support word line structures for three-dimensional memory arrays. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
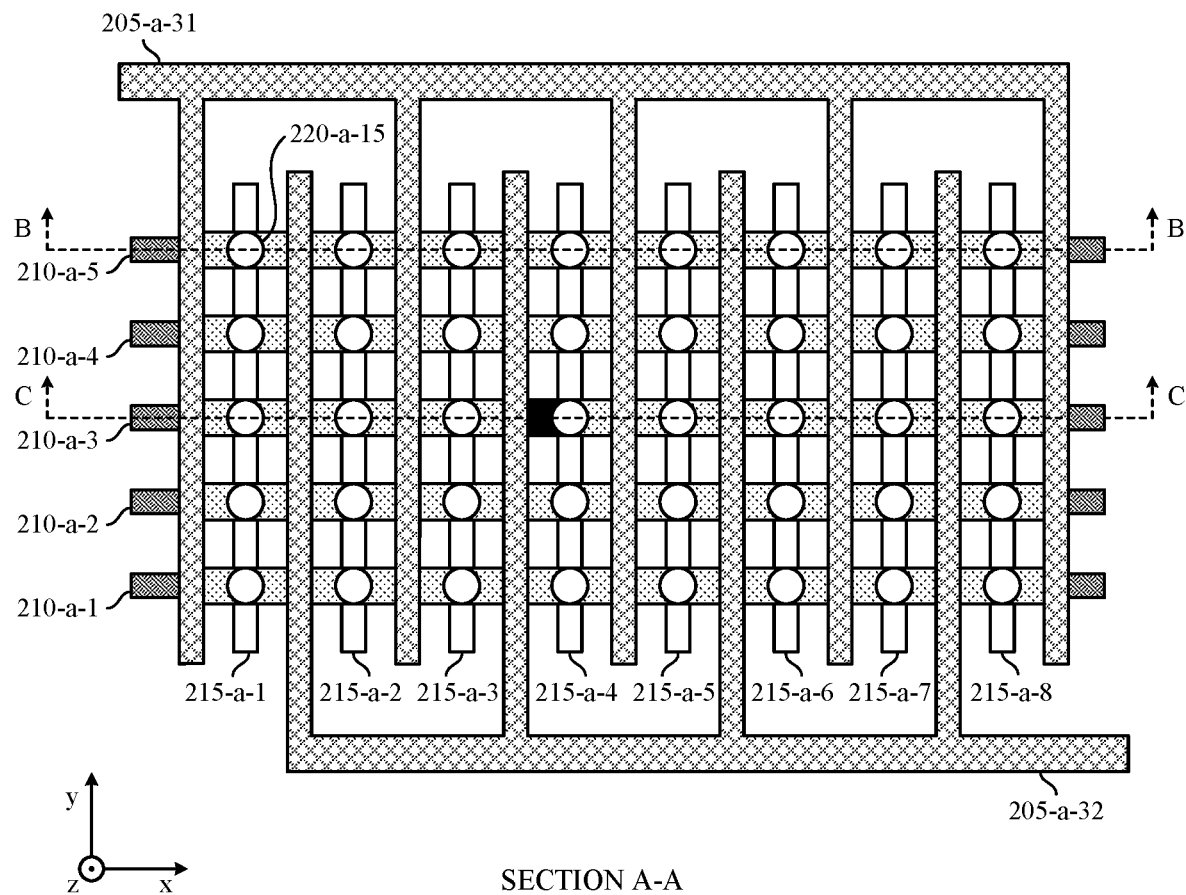
FIG. 2 illustrates a top view of an example of a memory array that supports word line structures for three-dimensional memory arrays in accordance with examples as disclosed herein.
Figure 3A:
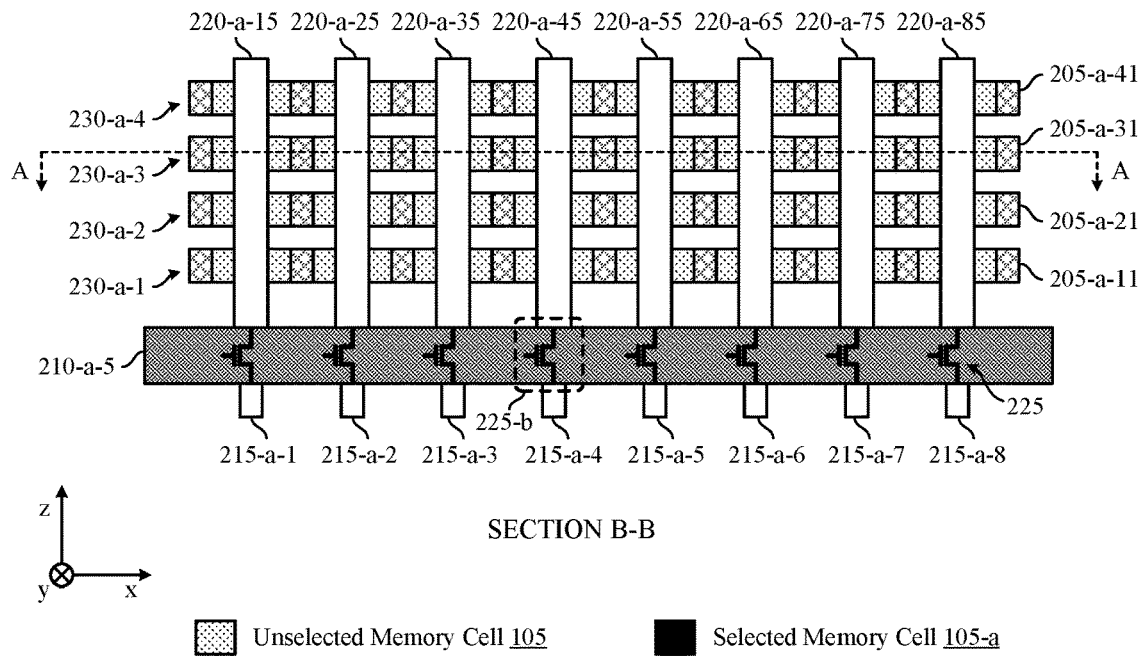
FIGS. 3A and 3B illustrate side views of an example of a memory array that supports word line structures for three-dimensional memory arrays in accordance with examples as disclosed herein.
Figure 3B:
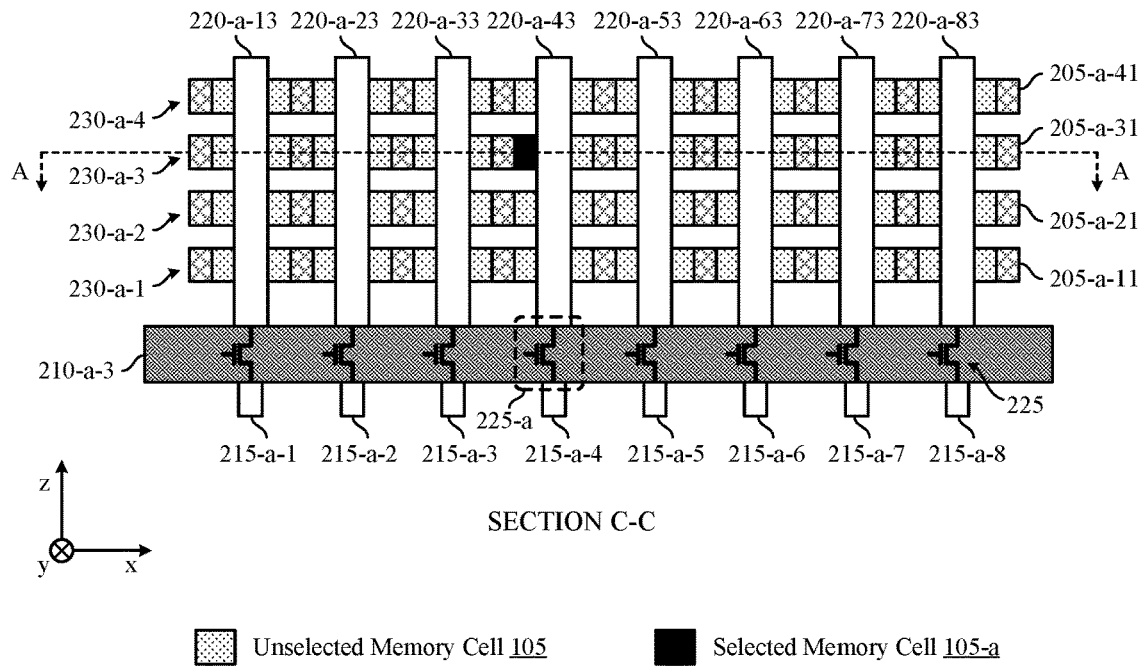

FIGS. 2, 3A, and 3B illustrate an example of a memory array 200 that supports word line structures for three-dimensional memory arrays in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200 may include two word lines 205 per level 230 (e.g., according to odd word lines 205-a-n1 and even word lines 205-a-n2 for a given level, n), where such word lines 205 of the same level 230 may be described as being interleaved (e.g., with portions of an odd word line 205-a-n1 projecting along the y-direction between portions of an even word line 205-a-n2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-a of the level 230-a-3 may be accessed according to an intersection between the pillar 220-a-43 and the word line 205-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-a, a corresponding access bias (e.g., the first voltage) may be applied to the word line 205-a-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-a-43, the sense line 215-a-4 may be biased with the access bias, and the gate line 210-a-3 may be grounded (e.g., biased to 0V) or otherwise biased with an activation voltage. In an example where the transistors 225 are n-type transistors, the gate line 210-a-3 being biased with a voltage that is relatively higher than the sense line 215-a-4 may activate the transistor 225-a (e.g., cause the transistor 225-a to operate in a conducting state), thereby coupling the pillar 220-a-43 with the sense line 215-a-4 and biasing the pillar 220-a-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-a is activated, or may be coupled with another voltage source (e.g., grounded, via a high-resistance path, via a leakage path) to avoid a voltage drift of the pillars 220. For example, a ground voltage being applied to the gate line 210-a-3 may not activate other transistors coupled with the gate line 210-a-3, because the ground voltage of the gate line 210-a-3 may not be greater than the voltage of the other sense lines 215 (e.g., which may be biased with a ground voltage or may be floating). Further, other unselected gate lines 210, including gate line 210-a-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-b coupled with the gate line 210-a-5 may be deactivated (e.g., operating in a non-conductive state), thereby isolating the voltage of the sense line 215-a-4 from the pillar 220-a-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

In accordance with examples as described herein, a memory device that implements the memory array 200 may include circuitry that enables the biasing of word lines 205 in accordance with access operations for memory cells 105. For example, the memory device may include word line structures distributed along the z-direction according to the levels 230. Each word line structure may include a word line plate that extends along the y-direction and the x-direction and is connected to each portion or projection of a word line 205 (e.g., an odd word line 205 or an even word line 205) that extends through the gaps between the pillars 220, where each portion of the word line 205 may be referred to as a word line member or a word line finger. In some examples, the memory device may include multiple word line plates at each level 230, such as a first word line plate connected to an odd word line 205 (e.g., word line 205-a-n1) and a second word line plate connected to an even word line 205 (e.g., word line 205-a-n2).

Each word line plate may include a contact that is operable to couple the word line plate to a word line decoder (e.g., a row line decoder 110). For example, a first via may be coupled with the word line decoder and extend through holes in the word line plates. A second via may be coupled with contact of the word line plate and extend through openings in word line plates above the word line plate. The first via and the second via may be coupled such that biasing (e.g., by a word line decoder) the first via to a first voltage (e.g., $V_{access}/2$) may bias the second via and thus the word line plate to the first voltage (e.g., or to a voltage that is approximately or similar to the first voltage). Due to the connection between the word line plate and a respective word line 205, biasing the word line plate to the first voltage may bias the respective word line 205 to the first voltage. Accordingly, by implementing such word line structures and associated circuitry (e.g., vias, pillars that support word line structure formation, among other components described herein), the memory device may support the biasing of word lines 205 and accessing of memory cells 105 in accordance with access operations.

Figure 4:
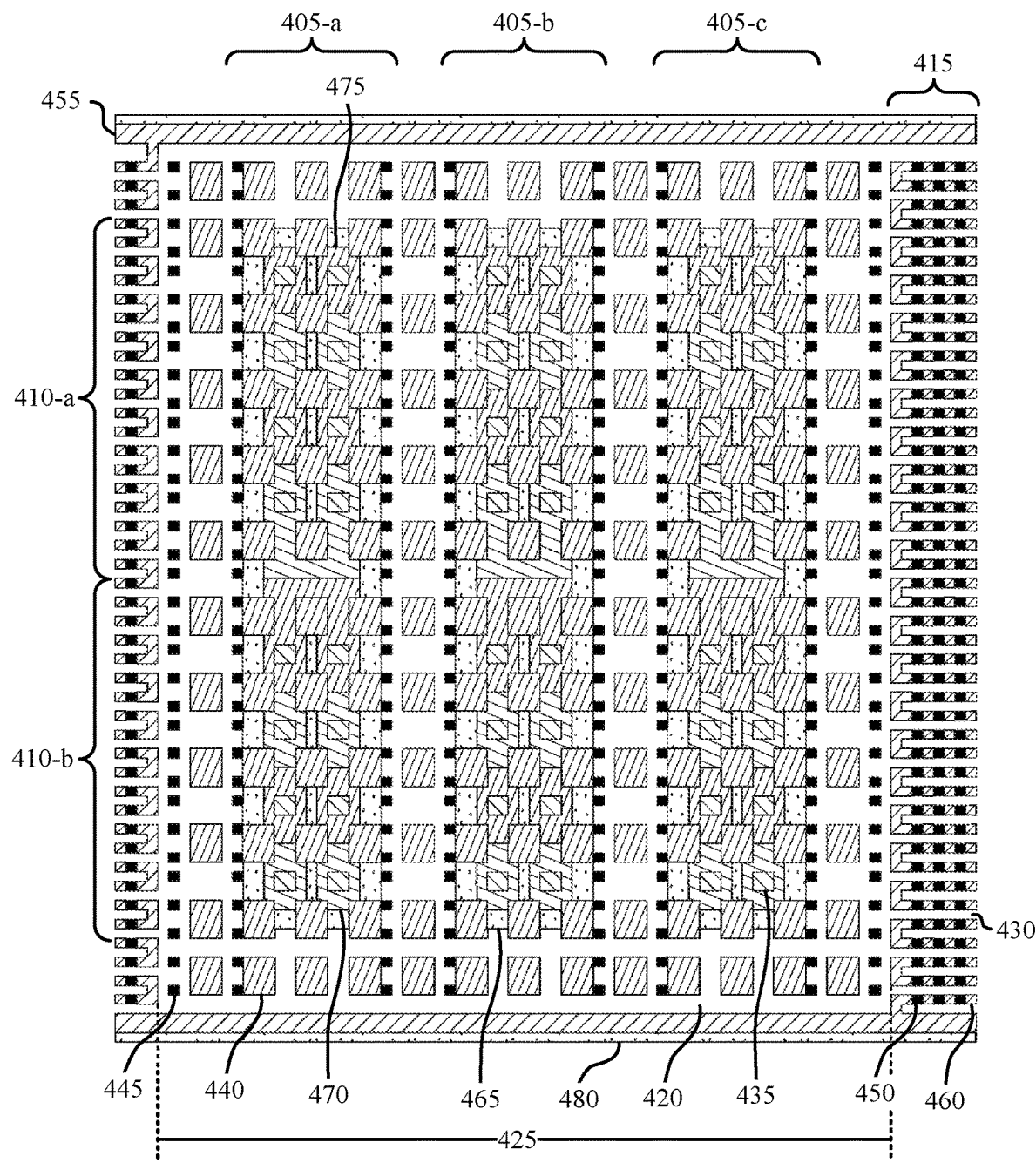
FIGS. 4, 5, 6, 7A, and 7B illustrate examples of layouts that support word line structures for three-dimensional memory arrays in accordance with examples as disclosed herein.

FIG. 4 illustrates an example of a layout 400 that supports word line structures for three-dimensional memory arrays in accordance with examples as disclosed herein. The layout 400 may be an example for implementing aspects of a memory array 200 described with reference to FIGS. 2, 3A, and 3B. For example, the layout 400 may include an arrangement of pillars 450, which may be examples of a pillar 220 described with reference to FIGS. 2, 3A, and 3B. The layout 400 may also include various arrangements of memory cells 105 (e.g., a three-dimensional array of memory cells 105), which also may be examples of memory cells 105 described with reference to FIGS. 2, 3A, and 3B, though such components are omitted from FIG. 4 for the sake of illustrative clarity. Aspects of the layout 400 may be described with reference to an x-direction (e.g., a row direction), a y-direction (e.g., a column direction), and a z-direction (e.g., a level direction).

The layout 400 includes an example architecture that may support word line biasing for accessing memory cells 105 arranged in a three-dimensional array (e.g., according to levels 230). For example, the layout 400 illustrates a top view of a memory device that implements a word line structure architecture that supports accessing the memory cells 105. The structures of the layout 400 may be located between boundaries 480 of the layout 400 along the y-direction, which are illustrated as gaps including separator materials for the sake of illustration.

The layout 400 may include one or more staircase regions 405. For example, the layout 400 may include a staircase region 405-a, a staircase region 405-b, and a staircase region 405-c. Each staircase region 405 may include one or more staircases 410, which may include structures that support word line biasing. For example, each staircase region 405 may include a staircase 410-a (e.g., a lower staircase) and a staircase 410-b (e.g., an upper staircase). Each staircase 410 may include a series of vias 435 (e.g., electrodes, conductive pillars) of varying heights that are operable to couple a respective word line structure to a word line decoder (e.g., located below word line structures included in the layout). In some cases, the vias 435 for each staircase 410 may be arranged in a plurality of rows extending in a first direction (e.g., x-direction) and at least one column extending in a second direction (e.g., y-direction), and a first quantity of the vias 435 in each row may be less than a second quantity of the vias 435 in the at least one column.

For example, at each level of memory cells 105 along the z-direction, the memory device may include one or more word line structures that each include a word line plate 420 and word line members 430. A word line plate 420 may be located within a word line plate region 425 of the layout 400, and each word line member 430 (e.g., of a respective level) may be connected to a word line plate 420. Each word line member 430 may also extend along the x-direction and into a respective memory region 415 of the layout 400, where a memory region 415 may correspond to a region of the layout 400 in which the memory cells 105 are located. For example, the layout 400 may include a first memory region 415 adjacent to a first side of the word line plate 420 (e.g., a right side of the word line plate 420), a second memory region 415 adjacent to a second side of the word line plate 420 opposite the first side (e.g., a left side of the word line plate 420), or both. The layout 400 may include a first quantity of word line members 430 along the y-direction that extend from the first side and into the first memory region 415 and a second quantity of word line members 430 along the y-direction that extend from the second side and into the second memory region 415. That is, each word line structure of the layout 400 may include a word line plate 420 that is connected to a first quantity of word line members 430 that extend in a first direction (e.g., along the positive x-direction) and into the first memory region 415, a second quantity of word line members 430 that extend in a second direction parallel and opposite to the first direction (e.g., along the negative x-direction) and into the second memory region 415, or both.

In some examples, the first quantity of word line members 430 may be the same as or different than the second quantity of word line members 430. In some cases, the quantity of word line members 430 along the y-direction included in the layout 400 may be based on a pitch between the word line members 430 along the y-direction (e.g., a 900 nanometer pitch, 1 micrometer pitch, or some other pitch along the y-direction). In some examples, a word line member 430 may be an example of a portion or a projection of a word line 205 as described with reference to FIGS. 2, 3A, and 3B. In some examples, the word line members 430 may correspond to an odd word line 205 or an even word line 205.

The word line plate region 425 (e.g., and thus the word line plate 420) may extend from the first memory region 415 to the second memory region 415 along the x-direction. The word line plate 420 may extend along the y-direction and be connected to each of the first quantity of word line members 430 and the second quantity of word line members 430 along the y-direction.

The word line plate 420 may be operable to bias the word line members 430 in accordance with access operations for memory cells 105 coupled between respective word line members 430 and respective pillars 450. For example, each memory region 415 may include a quantity of pillars 450 along the x-direction and the y-direction and, in some examples, may include a quantity of piers 460 along the x-direction and the y-direction, where the piers 460 may be formed during a manufacturing process of the layout 400 to provide mechanical support for structures in the memory regions 415 during various processing steps of the manufacturing process. Each pillar 450 may be coupled with a first memory cell 105 between a first side of the pillar 450 and a word line member 430 and coupled with a second memory cell 105 between a second side of the pillar 450 and a second word line member 430 that is connected to a second word line plate 420 (not shown) located at a same level as the word line plate 420 along the x-direction.

Due to the connection between the word line plate 420 and the word line members 430, biasing the word line plate 420 to a voltage may cause the word line members 430 to be biased to the voltage (e.g., or to a similar voltage based on a resistance between a via 435 coupled with the word line plate 420 and a respective word line member 430). Accordingly, to bias a word line member 430 to an access voltage (e.g., $V_{access}/2$) in accordance with an access operation for a memory cell 105 (e.g., in which a corresponding pillar 450 is biased to $-V_{access}/2$), the word line plate 420 connected to the word line member 430 may be biased to the access voltage (e.g., or a similar voltage based on the resistance between the via 435 coupled with the word line plate 420 and the word line member 430).

The layout 400 may include vias 440 (e.g., electrodes, conductive pillars) and vias 435, for example, to support biasing word line plates 420 to various voltages in accordance with access operations. For example, each staircase 410 may include vias 435 that are arranged in rows extending along the x-direction and in at least one column extending along the y-direction. In the example of layout 400, each staircase 410 may be arranged in four rows and two columns of vias 435, although other arrangements of vias 435 including any quantity of rows and columns of vias 435 are possible. Each via 435 may be coupled with a contact of a respective word line plate 420. For example, each word line plate 420 may include a metal contact that enables coupling with a via 435. Each via 435 may extend from the contact of the respective word line plate 420 (e.g., vertically) through an opening 470 or an opening 475 in the levels above the respective word line plate 420. For example, the layout 400 may include openings 470 and openings 475 that extend from an upper layer of the layout 400 along the z-direction down to a respective word line plate 420. If the layout 400 included 100 levels of word line structures and memory cells 105 along the z-direction (e.g., with intervening levels of dielectric material), a word line plate 420 at a 50th level may be coupled with a via 435 that extends along the z-direction from a contact of the word line plate 420 and through the 50 levels of word line plates 420 (e.g., and intervening levels of dielectric material) located above the word line plate by way of a respective opening 470 or an opening 475. In some examples, a material 465 may be deposited along the openings 470, 475 as described with reference to FIGS. 5 and 6 below, for example, to protect or insulate the word line plates 420 through which the openings 470, 475 are etched from exposure.

In some examples, a subset of the vias 440 may be used to couple vias 435 to a word line decoder such that the word line decoder may bias a corresponding word line plate 420. For example, the layout 400 may include a quantity of vias 440 arranged in an xy plane and that extend (e.g., vertically) along the z-direction and through holes in the word line plates 420. The vias 440 may be arranged in rows of vias 440 and columns of vias 440. The vias 440 may provide mechanical support and stability to the memory device. A subset of the vias 440 may each be coupled with a word line decoder that is operable to bias a given word line structure in accordance with an access operation. The vias 440 of the subset may each extend to the upper layer of the layout 400 and be coupled with a respective via 435 by an upper layer strapping (not shown) (e.g., a conductive strapping that is coupled with a respective via 440 of the subset and a respective via 435). Accordingly, by biasing a via 440, a word line decoder may bias a word line structure that is coupled with a via 435 coupled with the via 440. In some examples, vias 440 excluded from the subset may not be coupled with a word line decoder and a via 435. Such vias 440 may be referred to as dummy vias.

The layout 400 may include pillars 445 located in the word line plate region 425 that support the formation of the word line structures during a manufacturing process of the layout 400. For example, the pillars 445 may be deposited in cavities formed in the word line plate region 425 that enable the deposition of materials that form the word line structures at the corresponding levels. Accordingly, the pillars 445 may extend (e.g., vertically) along the z-direction and through the word line plates 420. The pillars 445 may also provide mechanical support and stability to the memory device.

The layout 400 may include any quantity of pillars 445 in the word line plate region 425. The pillars 445 may be arranged in columns that extend along the y-direction with each column including at least two pillars 445. In some cases, the pillars 445 may also be arranged in rows that extend along the x-direction. Various quantities of pillars 445, spacings between the pillars 445, and sizes of the pillars 445 (e.g., dimensions of the pillars 445 in the x- and y-directions) may be supported, as described in further detail in FIGS. 7A and 7B below.

The pillars 445 may be electrically isolated (e.g., insulated) from the word line plates 420. For example, the pillars 445 may be formed using a conductive material, which may be a same conductive material used to form the pillars 450. The pillars 445, however, may be electrically isolated from the word line structures such that a biasing of a word line plate 420 is unaffected by the pillars 445.

The pillars 445 may support the formation of the word line structures without electrically or physically separating (e.g., isolating) different portions of the word line plates. For example, in some cases of forming word line biasing circuitry, slits along the y-direction may be formed to enable the deposition of word line materials (e.g., instead of the pillars 445). The slits may section a word line plate 420 into different, electrically isolated portions, for example, due to portions not being physically connected. As a result, biasing a first portion of the word line plate 420 that is coupled with a via 435 may not bias a second portion of the word line plate 420 that is electrically isolated from the first portion. By implementing the pillars 445 to support the word line structure formation, each word line structure may include a contiguous electrical and physical connection from a contact of a word line plate 420 to each word line member 430.

In some examples, one or more pillars 445 may be used to couple a via 435 with a corresponding word line decoder. For example, one or more of the pillars 445 may be coupled with respective word line decoders and coupled with respective vias 435 via an upper layer strapping such that biasing the pillar 445 to a voltage may bias the respective via 435 to the voltage.

In some examples, portions of the word line plates 420 may span a distance along the y-direction and between the staircases 410-a and 410-b (e.g., between an opening 470 and an opening 475 between the staircases 410-a and 410-b). Such portions may decrease a resistance between a contact of a given word line plate 420 and a given word line member 430 connected to the word line plate 420.

To isolate (e.g., electrically, physically) the word line members 430 connected to a given word line plate 420 from word line members 430 connected to other word line plates 420 located at a same level as the word line members 430 and the word line plate 420 (e.g., to isolate an odd word line 205 from an even word line 205, or vice versa), the layout 400 may include dielectric material 455. For example, the dielectric material 455 may be deposited such that word line members 430 extending from the other word line plates 420 towards the word line plate 420 along the x-direction may be isolated (e.g., insulated) from the word line plate 420 and the word line members 430. In some examples, the dielectric material 455 may also be deposited between the word line plate 420 and each material 480.

Although the illustrative example of layout 400 includes various quantities of structures in the x-direction and the y-direction, the layout 400 in accordance with examples as disclosed herein may include any quantity of structures along the x-direction and the y-direction (e.g., including any quantity of staircases 410, word line members 430, vias 435, vias 440, pillars 445, pillars 450, piers 460 arranged in an xy plane). Additionally or alternatively, the layout 400 may be repeated one or more times along the x-direction.

Figure 5:
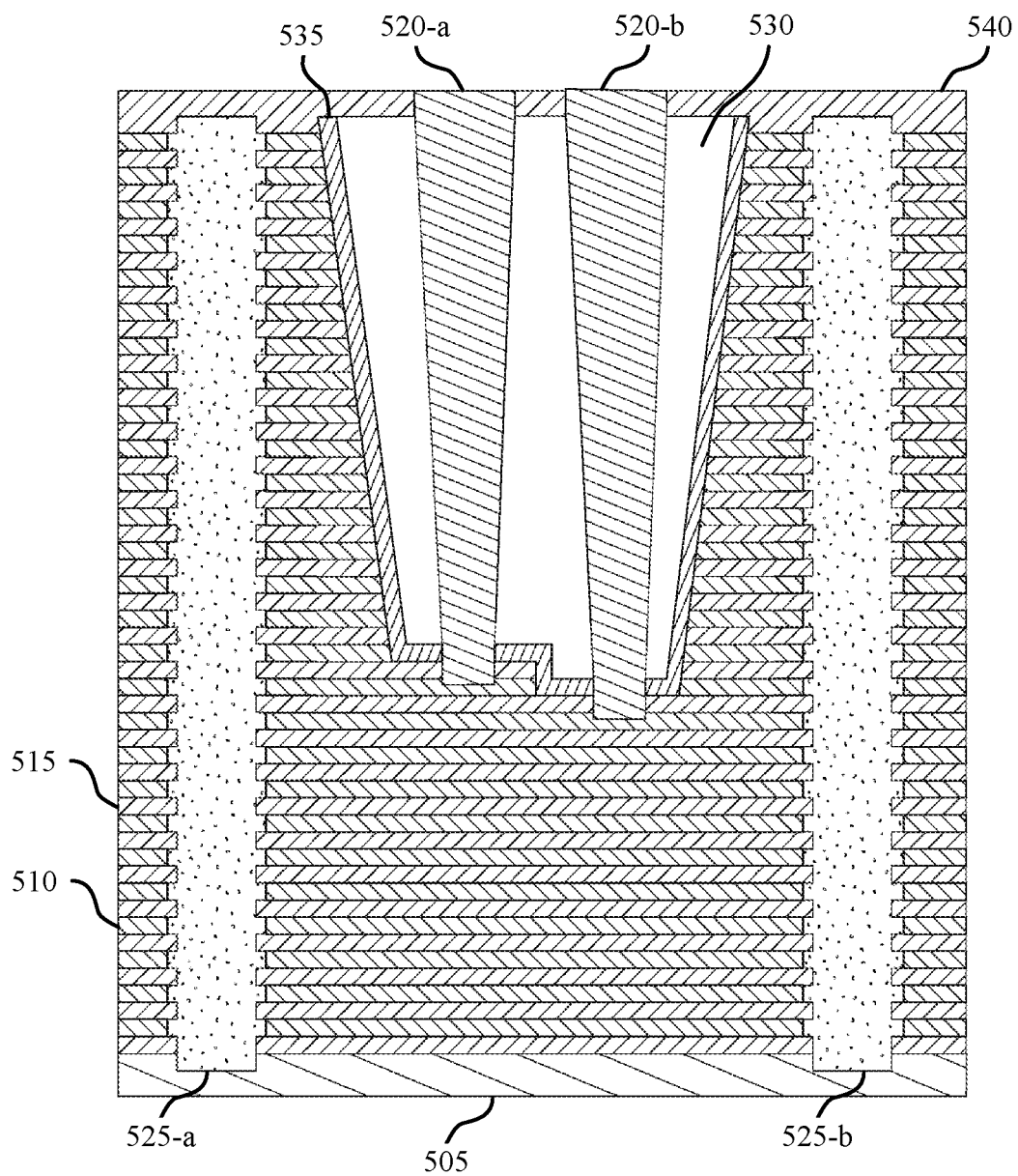

FIG. 5 illustrates an example of a layout 500 that supports word line structures for three-dimensional memory arrays in accordance with examples as disclosed herein. The layout 500 may be an example for implementing aspects of a layout 400 described with reference to FIG. 4. For example, the layout 500 may include an arrangement of vias 520 and vias 525, which may be examples of vias 435 and vias 440 described with reference to FIG. 4, respectively. Aspects of the layout 500 may be described with reference to an x-direction, a y-direction, and a z-direction.

The layout 500 depicts an example of a coupling between a via 435 and a via 440 described with reference to FIG. 4 to support word line plate biasing. For example, the layout 500 depicts a side view of a portion of a staircase 410 described with reference to FIG. 4. Specifically, the layout 500 depicts an example side view of a row of vias 435 included in a staircase 410 and corresponding vias 440 used to couple the vias 435 with corresponding word line decoders.

For example, the layout 500 may include a substrate 505 above which word line structures may be formed. The layout 500 may include alternating layers 510 and layers 515 above the substrate 505 along the z-direction. In some examples, the layers 515 may include a dielectric material, and the layers 510 may include conductive materials that form word line plates 420 described with reference to FIG. 4. That is, each of the layers 510 may correspond to a word line plate 420 of a word line structure formed along the z-direction and may be separated from each other by layers 515.

The layout 500 may include vias 525 that extend along the z-direction through holes in the layers 510 and the layers 515. For example, the layout 500 may include a via 525-a and a via 525-b that each extend through holes in the layers 510 and the layers 515 to an upper layer strapping 540. The via 525-a may be coupled with a first word line decoder that is formed on or above the substrate 505 (e.g., based on doping portions of the substrate 505). The via 525-b may be coupled with a second word line decoder that is formed on or above the substrate 505.

The layout 500 may include vias 520 that are operable to bias a respective word line plate coupled with the vias 520. For example, the layout 500 may include a via 520-a that is coupled with a first layer 510 (e.g., a contact of a first word line plate 420) and a via 520-b that is coupled with a second layer 510 (e.g., a contact of a second word line plate 420). The via 520-a and the via 520-b may each extend along the z-direction and through an opening 530 in the layers 510 and the layers 515 that are above the first layer 510 and the second layer 510 in the z-direction. Based on the respective couplings, a bias of the via 520-a may be passed to the first word line plate 420, and a bias of the via 520-b may be passed to the second word line plate 420. In some examples, the opening 530 may be formed as layers are deposited above the substrate 505. For example, during a manufacturing process of the layout 500, a location of the vias 520 and associated layers 510 may be determined. Masks may be used such that the opening 530 may be formed as the layers above the first layer 510 and the second layer 510 are formed (e.g., deposited). In some examples, a material 535 may be deposited in the opening 530 such that the layers 510 and the layers 515 exposed to opening 530 may be protected. For example, the material 535 may be an insulating or dielectric material that protects the layers 510 and the layers 515 from exposure.

The vias 520 may be coupled with respective vias 525 such that biasing of the vias 520 may be supported. For example, the via 520-a may be coupled with the via 525-a by a first portion of the upper layer strapping 540 (e.g., or a first upper layer strapping 540). The via 520-b may be coupled with the via 525-b via a second portion of the upper layer strapping 540 (e.g., or a second upper layer strapping 540 different from the first upper layer strapping 540). The upper layer strapping 540 may be a conductive material such that current may pass between the vias 520 and the vias 525. Accordingly, biasing the via 525-a to an access voltage (e.g., $V_{access}/2$) may cause the via 520-a to be biased to the access voltage. Additionally or alternatively, biasing the via 525-b to an access voltage may cause the via 520-b to be biased to the access voltage.

In the example of layout 500, the via 520-a and the via 520-b may correspond to two sequential steps of a folded staircase 410 in which more than one via 520 may be included in each row of the folded staircase 410. For example, the first layer 510 may correspond to a word line plate 420 that is at a next level above a word line plate 420 corresponding to the second layer 510. That is, the via 520-b may extend from a contact of a first word line plate 420 at a first level along the z-direction, and the via 520-a may extend from a contact of a second word line plate 420 at a next level above the first level along the z-direction. In some examples, additional vias 520 of the folded staircase 410 along the positive or negative y-direction may extend from next levels above or below the first word line plate 420 and the second word line plate (e.g., as described with reference to FIG. 8).

Figure 6:
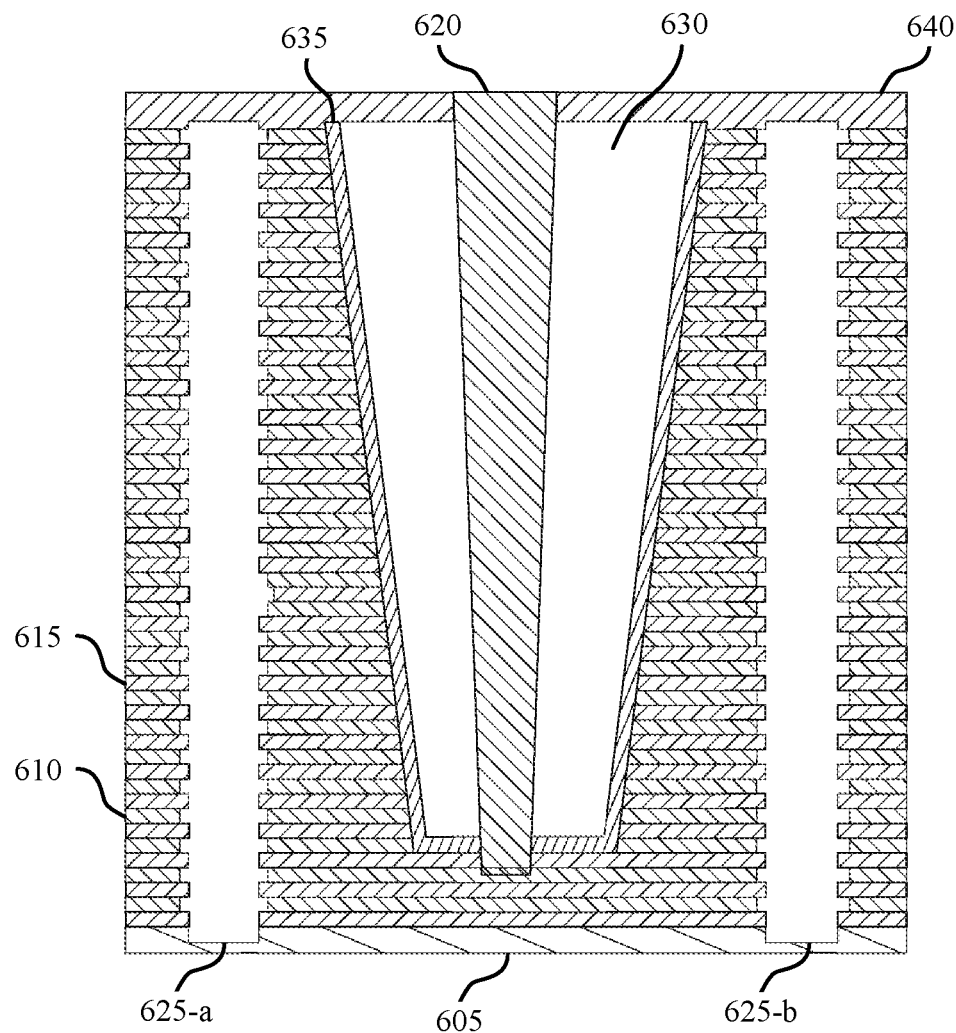

FIG. 6 illustrates an example of a layout 600 that supports word line structures for three-dimensional memory arrays in accordance with examples as disclosed herein. The layout 600 may be an example for implementing aspects of a layout 400 described with reference to FIG. 4. For example, the layout 600 may include a via 620 and vias 625, which may be examples of a via 435 and vias 440 described with reference to FIG. 4, respectively. Aspects of the layout 600 may be described with reference to an x-direction, a y-direction, and a z-direction.

The layout 600 depicts an example of a coupling between a via 435 and a via 440 described with reference to FIG. 4 to support word line plate biasing. For example, the layout 600 depicts a side view of a portion of a staircase 410 described with reference to FIG. 4. Specifically, the layout 600 depicts an example side view of a row of vias 435 included in a staircase 410 and a corresponding via 440 used to couple the vias 435 with corresponding word line decoders.

For example, the layout 600 may include a substrate 605 above which word line structures may be formed. The layout 600 may include alternating layers 610 and layers 615 above the substrate 605 along the z-direction, which may be examples of layers 510 and layers 615 described with reference to FIG. 5. For example, each of the layers 610 may correspond to a word line plate 420 of a word line structure formed along the z-direction and may be separated from each other by layers 615.

The layout 600 may include vias 625 that extend along the z-direction through holes in the layers 610 and the layers 615. For example, the layout 600 may include a via 625-a and a via 625-b that each extend through holes in the layers 610 and the layers 615 to an upper layer strapping 640, which may be an example of an upper layer strapping 540 described with reference to FIG. 5. In the example of layout 600, the via 625-a may be coupled with a first word line decoder that is formed on or above the substrate 505, and the via 625-b may correspond to a dummy via that provides mechanical support and stability to the layout 600 (e.g., is not coupled with a word line decoder or a via 620).

The layout 600 may include a via 620 that is operable to bias a respective word line plate coupled with the via 620. For example, the via 620 may be coupled with a first layer 610 (e.g., a contact of a first word line plate 420). The via 620 may extend along the z-direction and through an opening 630 in the layers 610 and the layers 615 that are above the first layer 610. Based on the coupling, a bias of the via 620 may be passed to the first word line plate 420. In some examples, the opening 630 may be an example of an opening 530 described with reference to FIG. 5 (e.g., may be formed as layers are deposited above the substrate 505). In some examples, a material 635 may be deposited in the opening 630, which may be an example of a material 535 described with reference to FIG. 5.

The via 620 may be coupled with the via 625-a such that biasing of the via 620 may be supported. For example, the via 620 may be coupled with the via 625-a by the upper layer strapping 640 (e.g., a first portion of the upper layer strapping 640). Accordingly, biasing the via 625-a to an access voltage (e.g., $V_{access}/2$) may cause the via 620 to be biased to the access voltage.

In the example of layout 600, the via 620 may correspond to a step of an unfolded staircase 410 in which one via 620 may be included in each row of the unfolded staircase 410.

In some examples, additional vias 620 of the unfolded staircase 410 along the positive or negative y-direction may extend from next levels above or below the first word line plate 420.

In some examples, a memory device may implement folded staircases 410, unfolded staircases 410, or both. For example, folded staircases 410 may be implemented to reduce a lateral dimension occupied by the staircase 410. For example, a 10-step folded staircase with two vias 620 (e.g., vias 435, vias 520) in each row may occupy less space in the y-direction than a 10-step unfolded staircase 410. Unfolded staircases 410 may be implemented to reduce a size (e.g., an area) of an opening through which vias 620 may extend (e.g., an opening 470, 475, 530, 630). For example, an opening through which one via 620 extends may be smaller than opening through which more than one via 620 extends. In some cases, unfolded staircases 410 may be implemented to couple with word line plates at relatively lower levels of a memory device. For example, openings may taper outwards up through the layers of the memory device. Accordingly, the more layers through which an opening is formed, the greater the area of the opening. Unfolded staircases 410 may be implemented to reduce a size of openings that extend down to lower levels of the memory device.

Figure 7A:
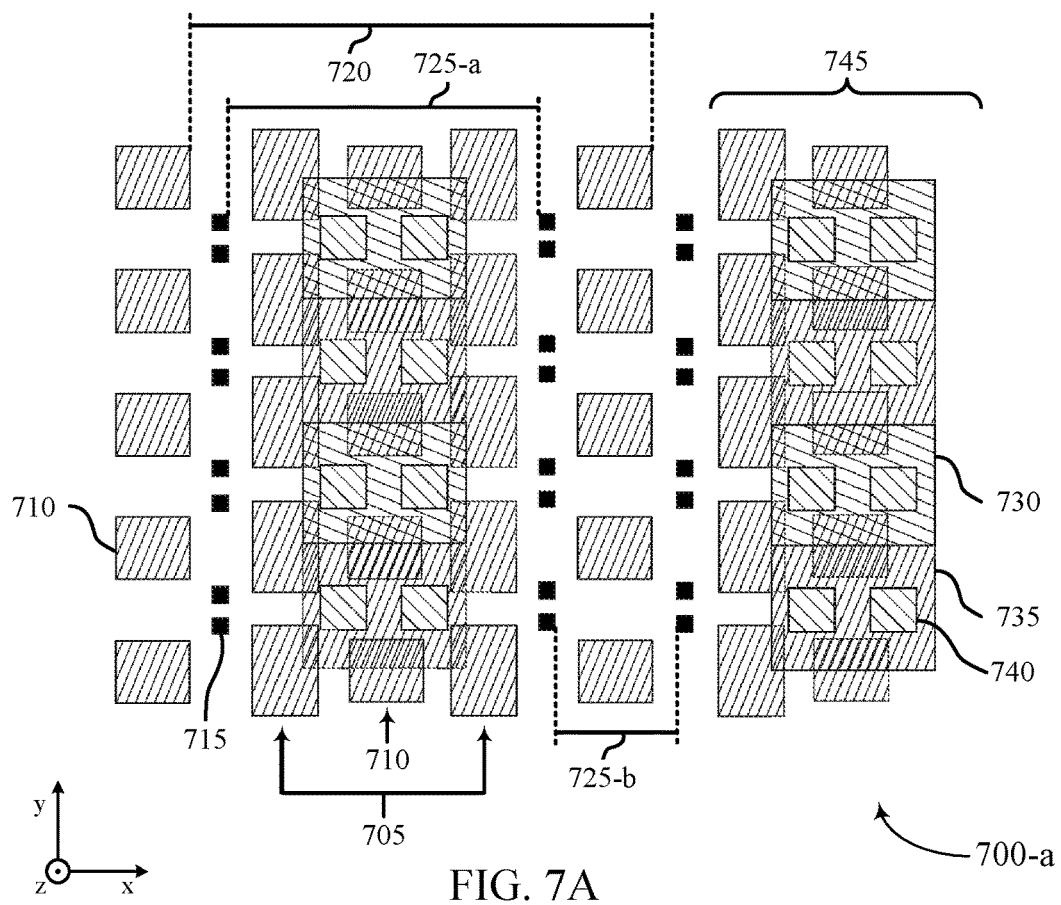
Figure 7B:
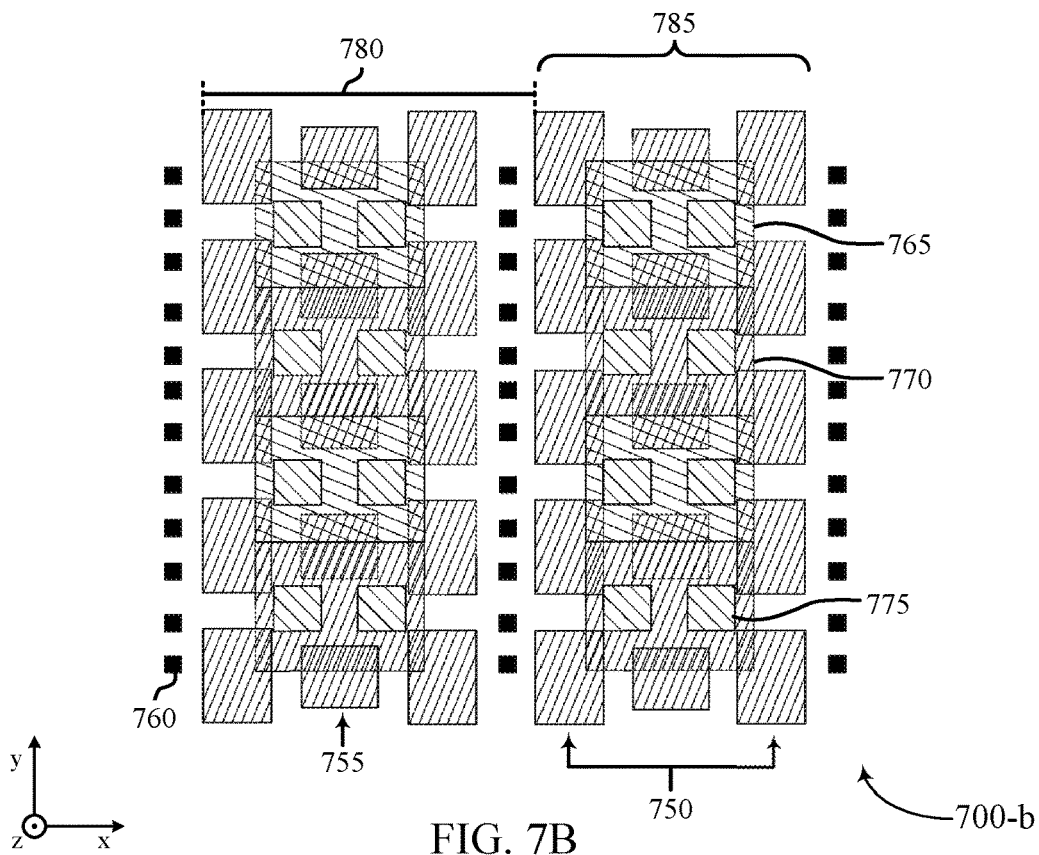

FIGS. 7A and 7B illustrate examples of layouts 700 that support word line structures for three-dimensional memory arrays in accordance with examples as disclosed herein. The layouts 700 may be examples of structural layouts of aspects of a layout 400 described with reference to FIG. 4. Aspects of the layouts 700 may be described with reference to an x-direction, a y-direction, and a z-direction.

For example, FIG. 7A illustrates a layout 700-a that includes an arrangement of vias 705 and vias 710, which may be examples of vias 440 described with reference to FIG. 4. The layout 700-a may also include arrangements of openings 730, openings 735, and vias 740, which may be examples of openings 470, openings 475, and vias 435, respectively, as described with reference to FIG. 4. In the example of layout 700-a, the openings 730 and the openings 735 are illustrated as at least partially overlapping with vias 705 and vias 710 (e.g., the vias 705 and the vias 710 may extend through portions of the openings 730 and 735). In some examples, however, the openings 730 and 735 may be non-overlapping with holes through which the vias 705 and the vias 710 extend.

The vias 705 may be examples of "live" vias, where live vias may correspond to vias 440 that are used to couple vias 435 to corresponding word line decoders such that the word line decoder may bias a corresponding word line plate 420. For example, each of the vias 705 may be coupled with a via 740 (e.g., by an upper layer strapping) and may be operable to bias the via 740 to an access voltage in accordance with an access operation.

The vias 710 may be examples of "non-live" or dummy vias, where dummy vias may correspond to vias 440 that are not coupled with a word line decoder or a via 435. For example, each of the vias 710 may be uncoupled from a word line decoder or a via 740 and may provide mechanical support and stability to a memory device.

In the example of layout 700-a, the vias 705 may be arranged in rows extending in a first direction (e.g., along the x-direction) and columns extending in a second direction orthogonal to the first direction (e.g., along the y-direction). The vias 710 may be arranged in rows extending in the first direction and columns extending in the second direction.

A pitch 720 between staircases (e.g., staircases 410) may be based on the arrangement of vias 705 and vias 710. In the example of layout 700-a, the vias 705 and the vias 710 may be formed such that a column of vias 710 is located between each column of vias 705. By including a column of vias 710 between each column of vias 705, the pitch 720 may be increased (e.g., relative to a pitch 780 described with reference to FIG. 7B). Such an increased pitch 720 may increase a space available for word line decoders coupled with the vias 705. Increasing such space may ease tolerances associated with forming the word line decoders and may accommodate increased variability of features of the word line decoders.

The layout 700-a may also include pillars 715, which may be examples of a pillar 445 described with reference to FIG. 4. The pillars 715 may be arranged in rows extending in the first direction and columns extending in the second direction. Various quantities of rows and columns of pillars 715 and various sizes of the pillars 715 (e.g., various dimensions of the pillars 715 in the x- and y-directions) may be supported. In the example of layout 700-a, the pillars 715 may be formed such that a column of pillars 715 is located between each columns of vias 705 and each columns of vias 710 located outside of a staircase region 745, which may be an example of a staircase region 405 described with reference to FIG. 4. As such, the layout 700-a may include various pitches 725 between columns of pillars 715. For example, a pitch 725-a between columns of pillars 715 separated by a staircase region 745 may be greater than a pitch 725-b between two columns of pillars 715 that are between staircase regions 745.

The rows of pillars 715 may be formed relatively close to rows of vias 740 in the y-direction (e.g., such that there is relative alignment between the rows of pillars 715 and rows of vias 740 in the y-direction). Such row formation may reduce a shielding of word line plate deposition by the vias 705 during manufacturing of the layout 700-a. For example, because the cavities in which the pillars 715 are formed are located relatively close to the vias 740 in the y-direction, blockage of the deposition of materials that form the word line plates may be reduced.

In some examples, the rows of pillars 715 may be formed relatively close to rows of vias 705 and vias 710 in the y-direction (e.g., such that there is relative alignment between the rows of pillars 715 and rows of vias 705 and 710 in the y-direction). Such row formation may increase a mechanical stability of the layout 700-a during a manufacturing of the layout 700-a, for example, due to the cavities in which the pillars 715 are formed being relatively close to the vias 705 and the vias 710.

In the example of layout 700-a, the cross-section of the pillars 715 is illustrated as a square, however, other shapes and dimensions of the pillars 715 may be implemented. For example, the pillars 715 may be formed such that respective cross-sections are rectangles, circles, triangles, ovals, trapezoids, or any other shape. Additionally, various dimensions of the pillars 715 in the x- and y-directions (e.g., various areas of the pillars 715) may be supported. Larger pillar 715 dimensions may be associated with increased efficiency of deposition processes, for example, due to the cavities in which the pillars 715 are formed being larger. Smaller pillar 715 dimensions may be associated with increased mechanical stability, for example, due to the cavities in which the pillars 715 are formed being smaller.

FIG. 7B illustrates a layout 700-b that includes an arrangement of vias 750 and vias 755, which may be examples of vias 440 described with reference to FIG. 4. The layout 700-b may also include arrangements of openings 765, openings 770, and vias 775, which may be examples of openings 470, openings 475, and vias 435, respectively, as described with reference to FIG. 4. In the example of layout 700-b, the openings 765 and the openings 770 are illustrated as at least partially overlapping with vias 750 and vias 755 (e.g., the vias 750 and the vias 755 may extend through portions of the openings 765 and 770). In some examples, however, the openings 765 and 770 may be non-overlapping with holes through which the vias 750 and the vias 755 extend.

The vias 750 may be examples of "live" vias. For example, each of the vias 750 may be coupled with a via 775 (e.g., by an upper layer strapping) and may be operable to bias the via 775 to an access voltage in accordance with an access operation. The vias 755 may be examples of "non-live" or dummy vias. For example, each of the vias 755 may be uncoupled from a word line decoder or a via 775 and may provide mechanical support and stability to a memory device.

In the example of layout 700-b, the vias 750 may be arranged in rows extending in a first direction (e.g., along the x-direction) and columns extending in a second direction orthogonal to the first direction (e.g., along the y-direction). The vias 755 may be arranged in rows extending in the first direction and columns extending in the second direction.

A pitch 780 between staircases (e.g., staircases 410) may be based on the arrangement of vias 750 and vias 755. In the example of layout 700-a, the vias 750 and the vias 755 may be formed such that a two columns of vias 750 are located between each pair of columns of vias 755 (e.g., a column of vias 755 is located between each pair of columns of vias 750 associated with a staircase region 785). By including two columns of vias 750 between each pair of columns of vias 755, the pitch 780 may be decreased (e.g., relative to a pitch 720 described with reference to FIG. 7B). Such a decreased pitch 780 may decrease a space (e.g., in the x-direction) occupied by the layout 700-a (e.g., the staircases 410, word line decoders coupled with the vias 755), which may reduce a size of a memory device that implements the layout 700-b.

The layout 700-b may also include pillars 760, which may be examples of a pillar 445 described with reference to FIG. 4. The pillars 760 may be arranged in rows extending in the first direction and columns extending in the second direction. Various quantities of rows and columns of pillars 760 and various sizes of the pillars 760 (e.g., various dimensions of the pillars 760 in the x- and y-directions, various shapes of the pillar 760 cross-sections) may be supported, for example, as described with reference to FIG. 7A In the example of layout 700-b, the pillars 760 may be formed such that a column of pillars 715 is located between each staircase region 785, which may be an example of a staircase region 405 described with reference to FIG. 4. The rows of pillars 715 may be formed uniformly in the y-direction.

FIG. 8 illustrates an example of a staircase diagram 800 that supports word line structures for three-dimensional memory arrays in accordance with examples as disclosed herein. The staircase diagram 800 may be an example for implementing aspects of a layout 400 described with reference to FIG. 4. For example, the staircase diagram 800 depicts an example layout of sequential staircases 410 described with reference to FIG. 4.

For instance, the staircase diagram 800 may include a staircase region 805-a, a staircase region 805-b, and a staircase region 805-c, which may each be respective examples of a staircase region 405 described with reference to FIG. 4. Each staircase region 805 may include a staircase 810-a and a staircase 810-b, which may be examples of a staircase 410-a and a staircase 410-b, respectively, as described with reference to FIG. 4.

The staircase diagram 800 depicts an arrangement of vias (e.g., vias 435) that may extend from respective contacts of word line plates at respective levels of a memory device. For example, the staircase diagram 800 depicts an arrangement of vias for a memory device that includes 132 levels of word line structures and memory cells 105, although any quantity of levels may be supported by the memory device.

In the example of staircase diagram 800, each staircase 810 may include vias that extend from 22 sequential levels of word line plates. For example, staircase 810-a of staircase region 805-a may include vias that extend from levels 1 through 22 of the memory device (e.g., L1 through L22), staircase 810-b of staircase region 805-b may include vias that extend from levels 23 through 44 of the memory device (e.g., L23 through 44), staircase 810-a of staircase region 805-b may include vias that extend from levels 45 through 66 of the memory device (e.g., L45 through 66), staircase 810-b of staircase region 805-b may include vias that extend from levels 67 through 88 of the memory device (e.g., L67 through 88), staircase 810-a of staircase region 805-c may include vias that extend from levels 89 through 110 of the memory device (e.g., L89 through 110), and staircase 810-b of staircase region 805-c may include vias that extend from levels 111 through 132 of the memory device (e.g., L111 through L132).

Each staircase 810 may arranged into rows of vias and columns of vias. In the example of staircase diagram 800, the staircases 810 may be examples of folded staircases in which the rows of vias include two or more vias (e.g., two in the example of staircase diagram 800), although one or more staircases 810 may be implemented as unfolded staircases. In the example of staircase diagram 800, the staircases 810 may increase steps in each column of a row and then increase with each row moving closer to the other staircase of a respective staircase region 805. For example, the staircase 810-a of staircase region 805-a may sequentially increase from L1 to L2 in a row furthest from the staircase 810-b of staircase region 805-a, from L3 to L4 in a next row, and so on up to L21 and L22 in a row adjacent to the staircase 810-b of staircase region 805-a. It is noted however, that other arrangements of the staircases 810 may be supported (e.g., decrease steps with each row moving closer to the other staircase of a respective staircase region 805, among other possible arrangements).

FIG. 9 through 20 illustrate examples of operations that support word line structures for three-dimensional memory arrays in accordance with examples as disclosed herein. For example, FIGS. 9 through 20 may illustrate aspects of a sequence of operations for fabricating aspects of a layout 900, which may be a portion of a memory device (e.g., a portion of a memory device 100, a portion of a memory array 200, a portion of a memory die, a layout 400). Each view of the figures may be described with reference to an x-direction, a y-direction, and a z-direction, as illustrated, which may correspond to the respective directions described with reference to the memory array 200. Some of the provided figures include section views that illustrate example cross-sections of the layout 900. For example, in FIGS. 9 through 20, a view "SECTION A-A" may be associated with a cross-section in an xz-plane (e.g., in accordance with a cut plane A-A) through a portion of the layout 900 that is associated with a memory region, a view "SECTION B-B" may be associated with a cross-section in an xz-plane (e.g., in accordance with a cut plane B-B) through a portion of the layout 900 that is associated with a word line structure and associated circuitry, and a view "SECTION C-C" may be associated with a cross-section in a yz-plane (e.g., in accordance with a cut plane C-C) through a portion of the layout 900 that is associated with the memory region. Although the layout 900 illustrates examples of certain relative dimensions and quantities of various features, aspects of the layout 900 may be implemented with other relative dimensions or quantities of such features in accordance with examples as disclosed herein.

Operations illustrated in and described with reference to FIGS. 9 through 20 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 9:
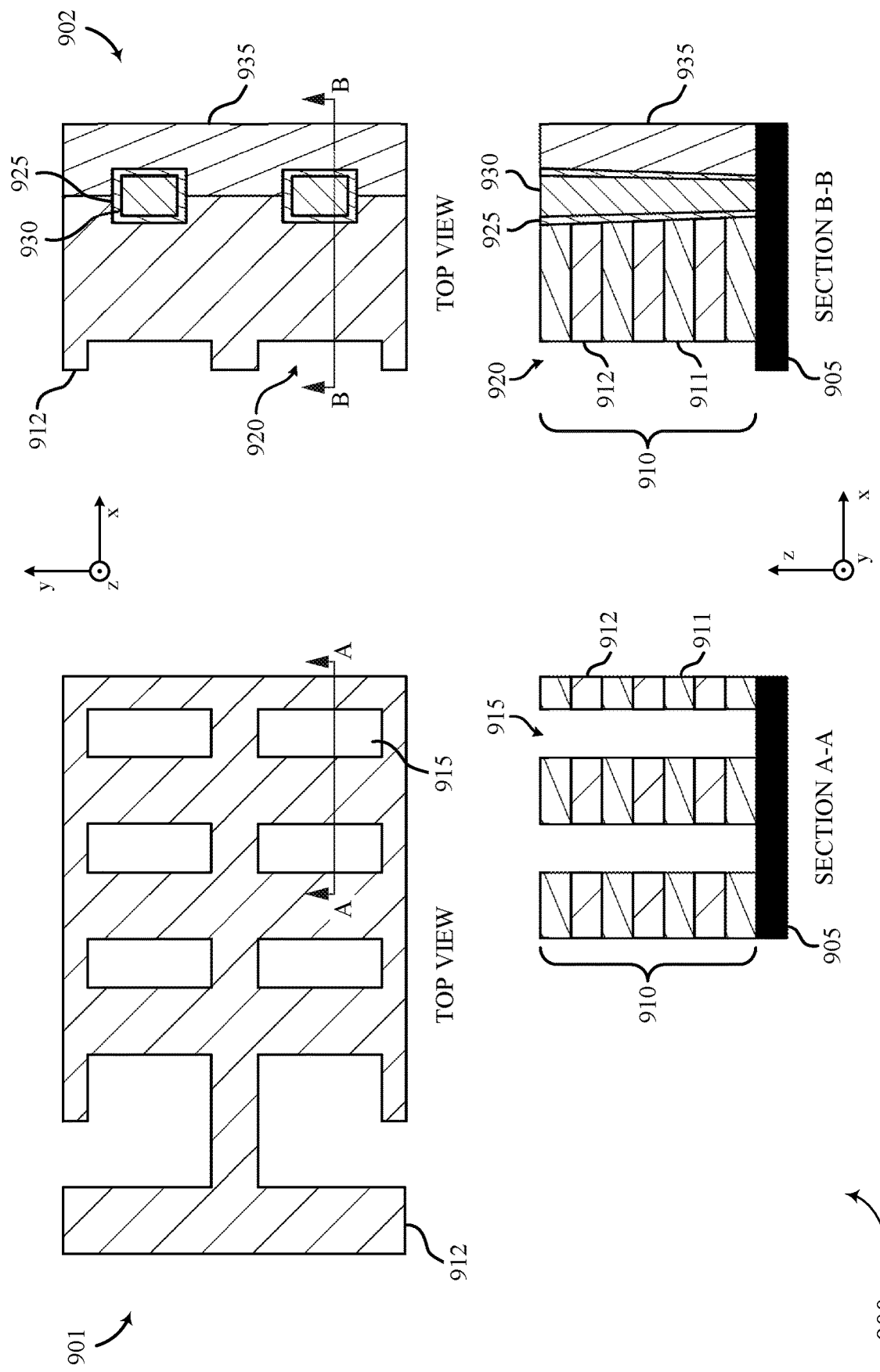
FIGS. 9, 10, 11, 12, 13, 14, 15, 16, 17, 18, 19, 20 illustrate examples of operations of a manufacturing process that supports word line structures for three-dimensional memory arrays in accordance with examples as disclosed herein.

FIG. 9 illustrates a portion 900-*a* of the layout 900 after a first set of one or more manufacturing operations. The first set of manufacturing operations may include depositing a stack of layers 910 over a substrate 905. The substrate 905 may be a semiconductor wafer or other substrate over which the stack of layers 910 is deposited. Although the stack of layers 910 is illustrated as being deposited in direct contact with the substrate 905, in some other examples, the layout 900 may include other materials or components between the stack of layers 910 and the substrate 905, such as interconnection or routing circuitry (e.g., access lines, sense lines 215, gate lines 210), control circuitry (e.g., transistors 225, aspects of a local memory controller 150, decoders, multiplexers), or another stack of layers 910 (e.g., another stack of layers 910 has been processed in accordance with examples as disclosed herein), which may include various conductor, semiconductor, or dielectric materials between the stack of layers 910 and the substrate 905. For example, the layout 900 may include a layer including thin-film-transistors (TFTs) between the substrate 905 and the stack of layers 910, such as transistors 225, among others. In some examples, the substrate 905 itself may include such interconnection or routing circuitry.

The stack of layers 910 may include alternating layers of a first material 911 and a second material 912 (e.g., in accordance with alternating material deposition operations). In some examples, the first material 911 may include a dielectric material (e.g., a first dielectric material), such as an oxide (e.g., a tier oxide), and may provide electrical isolation between levels 230. The second material 912 may include various materials that are different than the first material 411, which may support differential processing (e.g., differential etching, high selectivity). For example, the layers of the second material 912 may be sacrificial layers. In some examples, the second material 912 may be a dielectric material, such as a nitride (e.g., a tier nitride). Although the stack of layers 910 is illustrated with seven layers (e.g., three layers of the first material 911 and four layers of the second material 912), a stack of layers 910 in accordance with examples as disclosed herein may include any quantity of layers of each of two or more materials (e.g., tens of layers, hundreds of layers, and so on).

The stack of layers 910 may be deposited in a memory region 901 and a word line plate region 902, which may be examples of a memory region 415 and a word line plate region 425, respectively, as described with reference to FIG. 4. The memory region 901 and the word line plate region 902 are depicted as being separate from each other in the x-direction for clarity, however, the memory region 901 and the word line plate region 902 may be adjacent to one other, for example, as depicts in the example of FIG. 4. Additionally, the top view of the word line plate region 902 may illustrate a view of the layout 900 at a level corresponding to the second material 912.

The first set of manufacturing operations may also include operations that support forming vias 930 in the word line plate region 902 that provide mechanical support and stability to the word line plate region 902 and may be operable to couple a word line decoder (e.g., a TFT between the substrate 905 and the stack of layers 910) with a word line plate (e.g., by way of a via 435 (not shown)). For example, the first set of manufacturing operations may include forming (e.g., etching) a set of cavities in the word line plate region 902 and depositing a conductive material in the set of cavities to form the vias 930. The first set of manufacturing operations may also include depositing a material 925 (e.g., a dielectric material, such as an oxide material), which may surround sidewalls of a via 930 and function to electrically isolate the via 930 from the stack of layers 910. The first set of manufacturing operations may also include depositing a dielectric material 935 (e.g., an oxide material) in the word line plate region 902, which may be a same material as the first material 911 or the material 925. Alternatively, the first material 911 and second material 912 may extend into the region illustrated as having dielectric material 935.

In some examples, the first set of manufacturing operations may also include planarizing the stack of layers 910, the vias 930 (e.g., and the material 925), and the dielectric material 935 after deposition of the materials. In some examples, one or more materials (not shown) may be subsequently deposited over one or more of the stack of layers 910, the vias 930, the material 925, and the dielectric material 935. For example, a dielectric material may be subsequently deposited. In some cases, the dielectric material may be etched to a top surface of a via 930 and a conductive material may be deposited to form an upper layer strapping such as an upper layer strapping 540, 640.

The first set of manufacturing operations may also include operations (e.g., a pillar etch operation, a pier etch operation) that support forming pillars, piers, or both, in accordance with examples as disclosed herein. For example, the first set of manufacturing operations may include forming a set of cavities 915 through the stack of layers 910 in the memory region 901 (e.g., by removing portions of the first material 911 and the second material 912 along the z-direction to the substrate 905 or to an intervening material between the stack of layers 910 and the substrate 905) and forming a set of cavities 920 through the stack of layers in the word line plate region 902. The cavities 915 and the cavities 920, and pillars, piers, or both, formed therein, may support features having various aspect ratios (e.g., a ratio of depth along the z-direction to width along the x-direction, y-direction, or both), such an aspect ratio of 50:1 or more, and various cross-sectional shapes.

Figure 10:
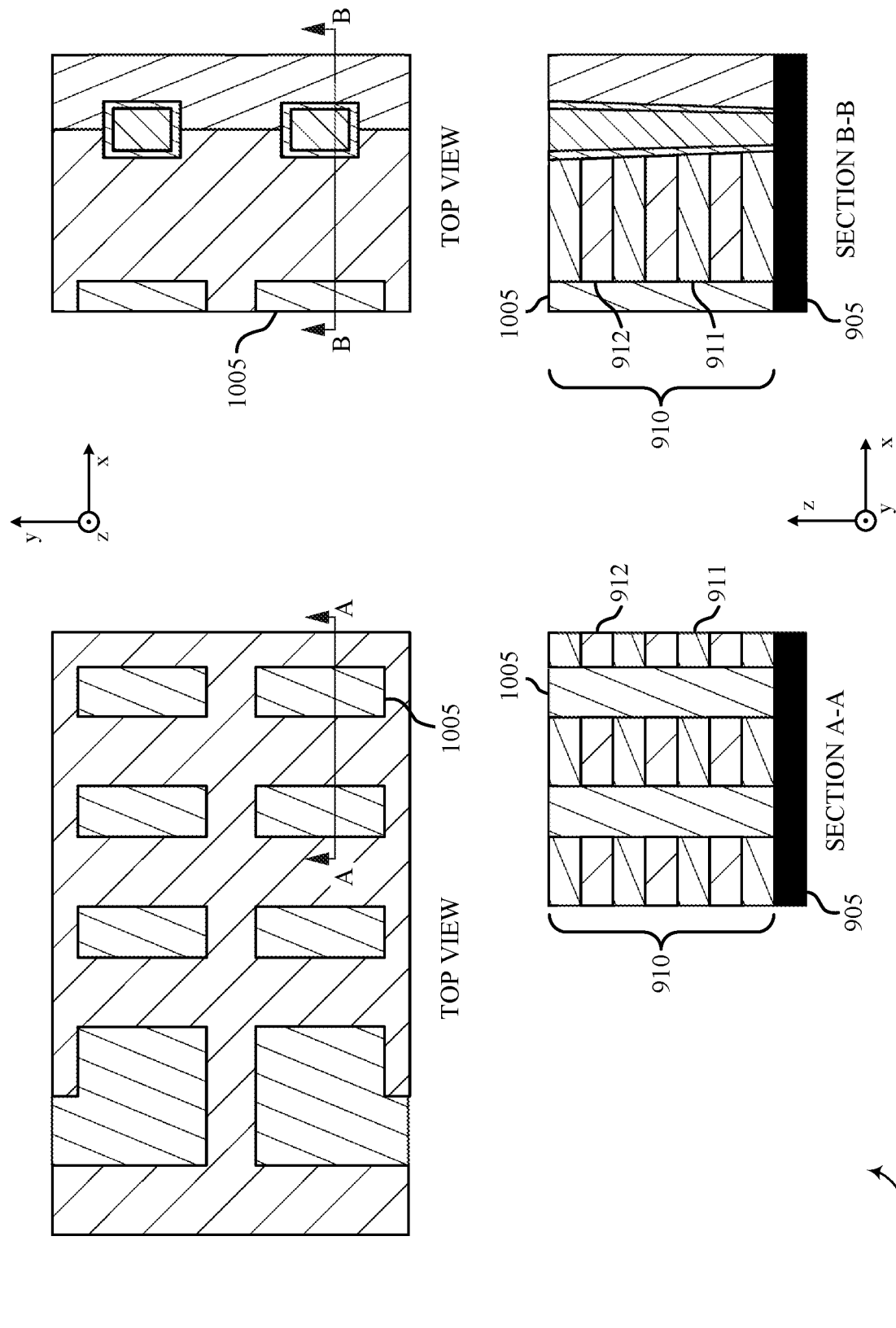

FIG. 10 illustrates a portion 900-*b* of the layout 900 after a second set of one or more manufacturing operations. The second set of manufacturing operations may include further operations (e.g., a pier fill operation, a pier gap fill operation) that support forming piers in accordance with examples as disclosed herein. For example, the second set of manufacturing operations may include forming a set of piers 1005 through the stack of layers 910 by depositing one or more materials (e.g., one or more third materials), such as dielectric material (e.g., a second dielectric material) or a semiconductor (e.g., polysilicon), among other materials, in the cavities 915 and the cavities 920 (e.g., filling the cavities 915 and the cavities 920). In some examples, the material of the piers 1005 may be an oxide (e.g., a pier oxide), which may be the same as or similar to the first material 411. In some examples, the material of the piers 1005 may be chosen for having relatively high strength, high stiffness, or bonding strength with the first material 911. In some examples, the material of the piers 1005 may be chosen for having a high selectivity for differential processing relative to the second material 912, such as examples where the second material 912 is removed in subsequent operations. In some examples, the piers 1005 may be formed from multiple materials, such as when a pier 1005 is formed by first depositing a liner material (e.g., a dielectric liner) in the cavities 915, followed by filling the liner material (e.g., with a material that may be a conductor or semiconductor). In some examples, the second set of manufacturing operations may include a polishing or planarization operation to flatten a top surface of the layout 900, which may support aspects of subsequent operations.

Figure 11:
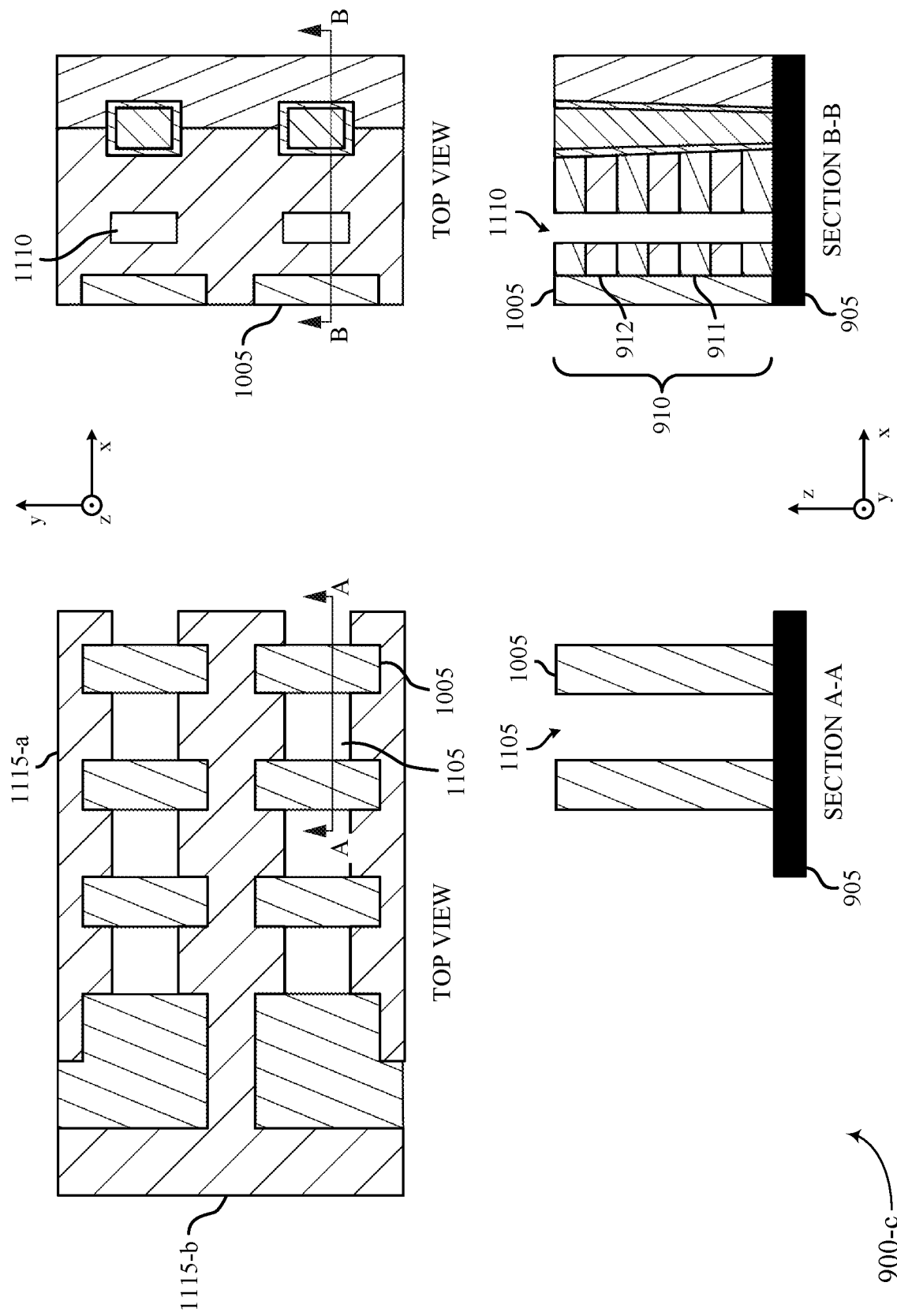

FIG. 11 illustrates a portion 900-c of the layout 900 after a third set of one or more manufacturing operations, with the substrate 905 omitted from the top views of the memory region 901 and the word line plate region 902 for illustrative clarity of viewing the cut planes B-B and C-C. The third set of manufacturing operations may include operations (e.g., comb patterning operations) that support forming an interleaved pair of comb structures. For example, the third set of manufacturing operations may include depositing a masking material (e.g., a comb hardmask) over the piers 1005 and portions of the stack of layers 910 (e.g., over a top layer of the stack of layers 910). In some examples, the masking material may be deposited at least partially in a comb pattern (e.g., as viewed in an xy-plane).

The third set of manufacturing operations may also include further operations (e.g., comb etch operations) that support forming an interleaved pair of comb structures 1115. For example, the third set of manufacturing operations may include removing (e.g., etching) portions of the stack of layers 910 between the previously-deposited masking material (e.g., along the z-direction, to the substrate 905 or to an intervening material between the stack of layers 910 and the substrate 905), which may form a set of cavities 1105 in the memory region 901 and a set of cavities 1110 in the word line plate region 902 along the z-direction.

In some cases, a length in the y-direction of each cavity 1105 of the set of cavities 1105 may be less than a length in the y-direction of each pier 1005. For example, each pier 1005 may extend past a respective cavity 1105, which may provide increased mechanical support (e.g., relative to a pier having a same length as a corresponding cavity), for example by more effectively truncating a memory cell formed in a cavity 1105 (e.g., around a pillar in the cavity 1105).

Forming the set of cavities 1105 may define a set of interleaved comb structures, such as a first comb structure 1115-a and a second comb structure 1115-b. In some cases, each comb structure of the set of interleaved comb structure may include a set of "teeth" or tines extending horizontally (e.g., in the x-direction) from a base. The tines of the first comb structure 1115-a may alternate (e.g., in the y-direction) with the tines of the second comb structure 1115-b. The set of interleaved comb structures may correspond to one or more word line plates (e.g., the first comb structure 1115-a may correspond to a first word line plate, and the second comb structure 1115-b may correspond to a second word line plate), as described in greater detail with reference to FIG. 11. In some examples, forming the set of interleaved comb structures using two etching steps (e.g., the etching of the piers 1005 and the etching of the cavities 1105) may reduce complexity of the manufacturing process relative to other manufacturing process which may use a greater quantity of etching steps to form a set of interleaved comb structures.

Forming the set of cavities 1110 may enable the formation of word line structures at levels 230. For example, forming the set of cavities 1110 may enable subsequent manufacturing operations in which materials are etched (e.g., the second material 912) and deposited in the word line plate region 902 to form the word line structures, as described in additional detail with reference to FIGS. 12-18.

Figure 12:
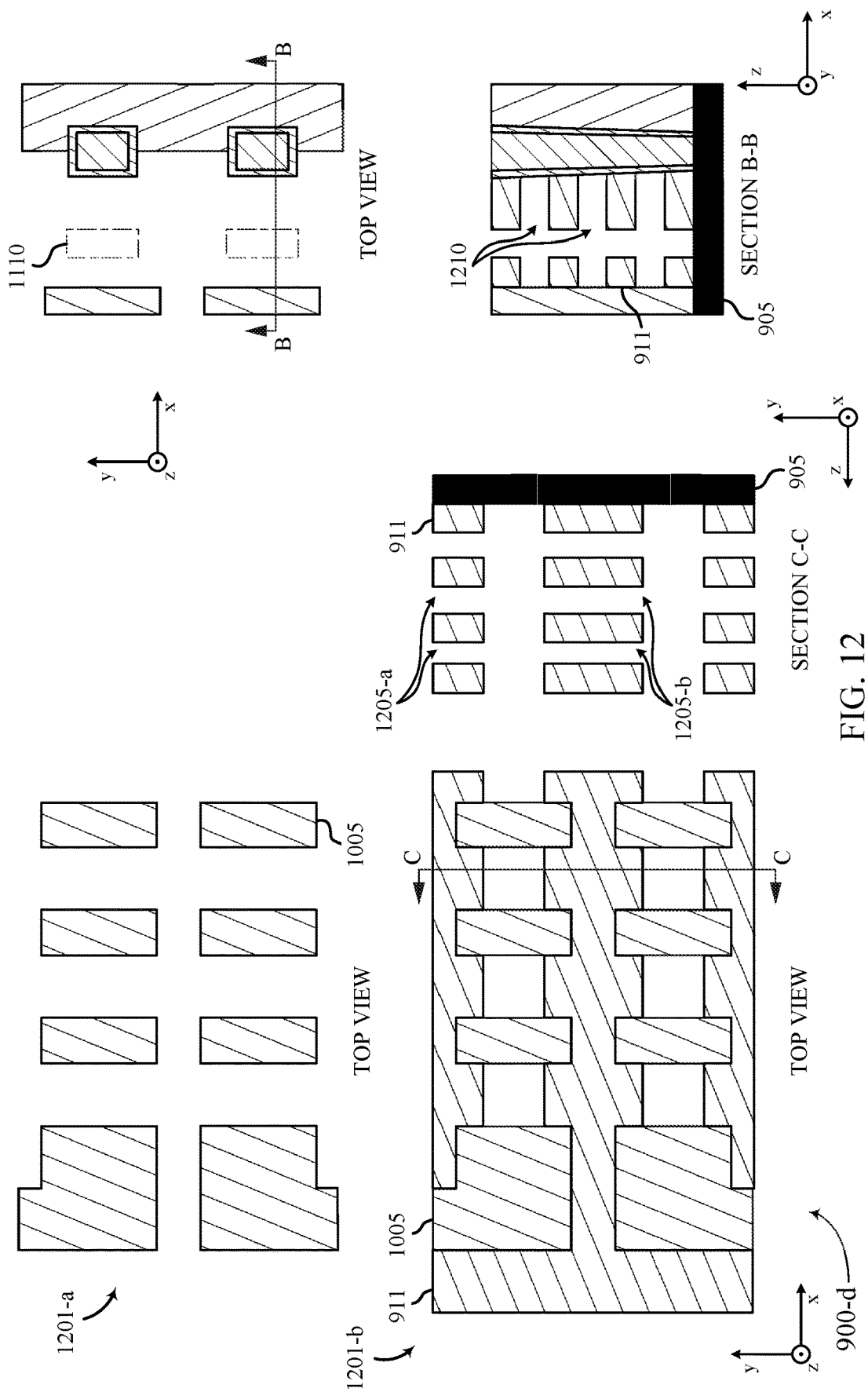

FIG. 12 illustrates a portion 900-d of the material layout 900 after a fourth set of one or more manufacturing operations, with the substrate 905 omitted from the top views of the memory region 901 and the word line plate region 902 for illustrative clarity of viewing the cut planes B-B and C-C. View 1201-a illustrates a top view of the memory region 901 at a first level corresponding to the second material 912, while view 1201-b illustrates a top view of the memory region 901 at a second level corresponding to the first material 911. Additionally, the top view of the word line plate region 902 is illustrated at the first level corresponding to the second material 912.

The fourth set of manufacturing operations may include operations (e.g., exhumation operations, nitride exhumation) that support forming voids in the comb structures 1115. For example, the fourth set of manufacturing operations may include removing (e.g., etching, exhuming) the second material 912 from the first comb structure 1115-a and the second comb structure 1115-b, which may form a set of first voids 1205-a between the layers of the first material 911 of the first comb structure 1115-a, and a set of second voids 1205-b between the layers of the first material 411 of the second comb structure 1115-b.

After the second material 912 has been removed, the set of piers 1005 may provide mechanical support for the tines of the set of interleaved comb structures 1115. For example, the set of piers 1005 may remain in contact with the layers of the first material 911, and may prevent or reduce movement of the tines of the set of comb structures during this and subsequent steps of the manufacturing process.

The fourth set of manufacturing operations may additionally include operations (e.g., exhumation operations, nitride exhumation) that support forming voids in the word line plate region 902. For example, the fourth set of manufacturing operations may include removing the second material 912 from the word line plate region 902 (e.g., by way of cavities 1110), which may form a set of voids 1210 between the layers of the first material 911 of the word line plate region 902.

Figure 13:
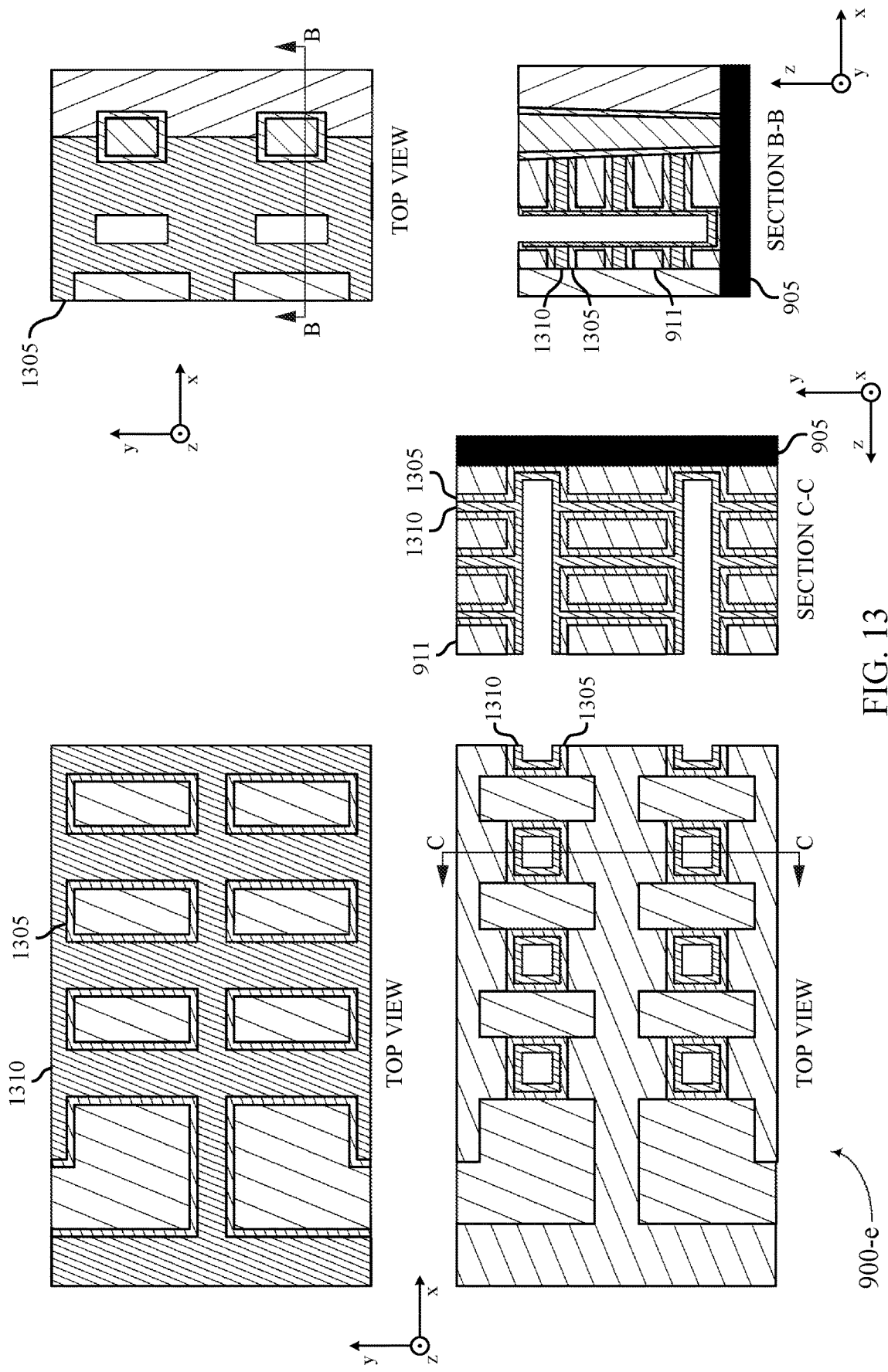

FIG. 13 illustrates a portion 900-e of the layout 900 after a fifth set of one or more manufacturing operations. The fifth set of manufacturing operations may include operations (e.g., one or more metal deposition operations) that support forming a plurality of word line members 430 (e.g., at each level 230) based at least in part on depositing one or more conductive materials in the set of first voids 1205-a and in the set of second voids 1205-b, respectively. For example, the fifth set of manufacturing operations may include depositing a first conductive material 1305 on exposed surfaces of the layout 900, which may include depositing the first conductive material 1305 in contact with the layers of the first material 911 of the first comb structure 1115-a, in contact with the layers of the first material 911 of the second comb structure 1115-b, and in contact with the substrate 905. In some examples, the first conductive material 1305 may include a barrier material (e.g., a conductive barrier, a liner material, a ceramic material) such as titanium nitride (TiN), titanium silicon nitride (TiSiN), tungsten silicon nitride (WSiN), or others.

In some examples, the fifth set of manufacturing operations may also include depositing a second conductive material 1310 on exposed surfaces of the first conductive material 1305, which may include depositing the second conductive material 1310 in contact with the first conductive material 1305 to fill remaining portions of the set of first voids 1205-a and remaining portions of the set of second voids 1205-b. In some examples, the second conductive material 1310 may include a metal material, such as tungsten, or a metal alloy.

The fifth set of manufacturing operations may also include operations that support forming a plurality of word line plates 420 connected to the plurality of word line members 430 based at least in part on depositing one or more conductive materials in the set of voids 1210. For example, the fifth set of manufacturing operations may include depositing the first conductive material 1305 in contact with the layers of the first material 911 of the word line plate region 902 and in contact with the substrate 905. In some examples, the fifth set of manufacturing operations may also include depositing the second conductive material 1310 on exposed surfaces of the first conductive material 1305 of the word line plate region 902 to fill remaining portions of the set of voids 1210.

In some examples, the fifth set of manufacturing operations may include depositing a single conductive material (e.g., omitting a barrier material), such as when the single conductive material is compatible with adjacent materials (e.g., compatible with the substrate 905, compatible with the first material 911, compatible with a material deposited in contact with the single conductive material in a later operation).

Figure 14:
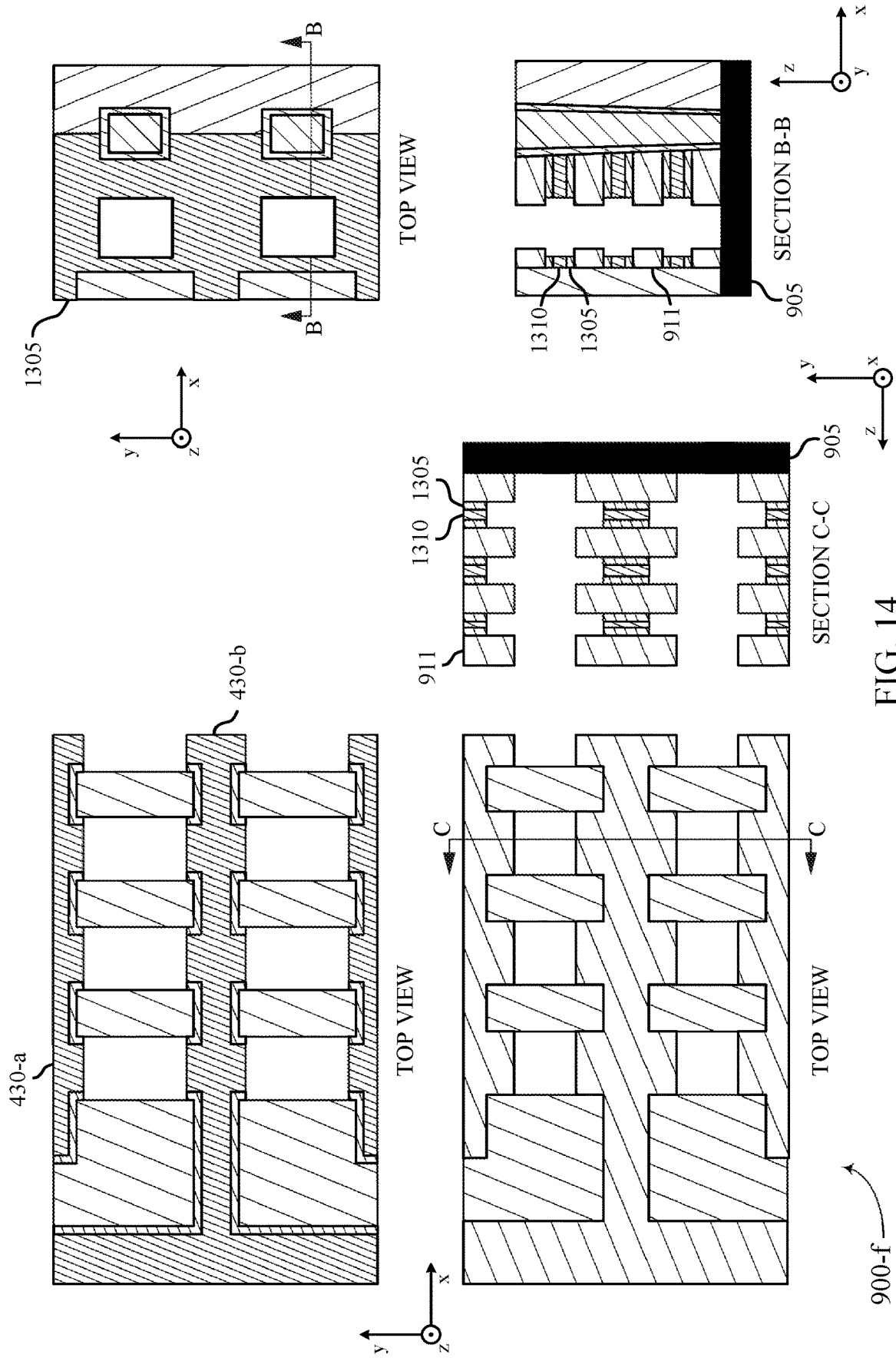

FIG. 14 illustrates a portion 900-f of the layout 900 after a sixth set of one or more manufacturing operations. The sixth set of manufacturing operations may include further operations (e.g., a metal recess etch) that support forming the plurality of word line members 430 and the plurality of word line plates 420. For example, the sixth set of manufacturing operations may include removing (e.g., etching) exposed portions of the first conductive material 1305 and the second conductive material 1310, which may recess portions of the first conductive material 1305 and the second conductive material 1310 to be within the voids 1205 and the voids 1210, and which may expose the substrate 905 and at least sidewalls of the first material 911. Such operations may clear the first conductive material 1305 and the second conductive material 1310 from the cavities 1105 and 1110. Additionally, the recessing may form the word line members 430 and the word line plates 420. For example, word line members 430-a may be formed from the remaining first conductive material 1305 and the second conductive material 1310 in the first comb structure 1115-a, and word line members 430-b may be formed from the remaining first conductive material 1305 and the second conductive material 1310 in the second comb structure 1115-b. Additionally, the remaining first conductive material 1305 and the second conductive material 1310 in the word line plate region 902 may form word line plates 420 that are connected to the word line members 430-a.

Figure 15:
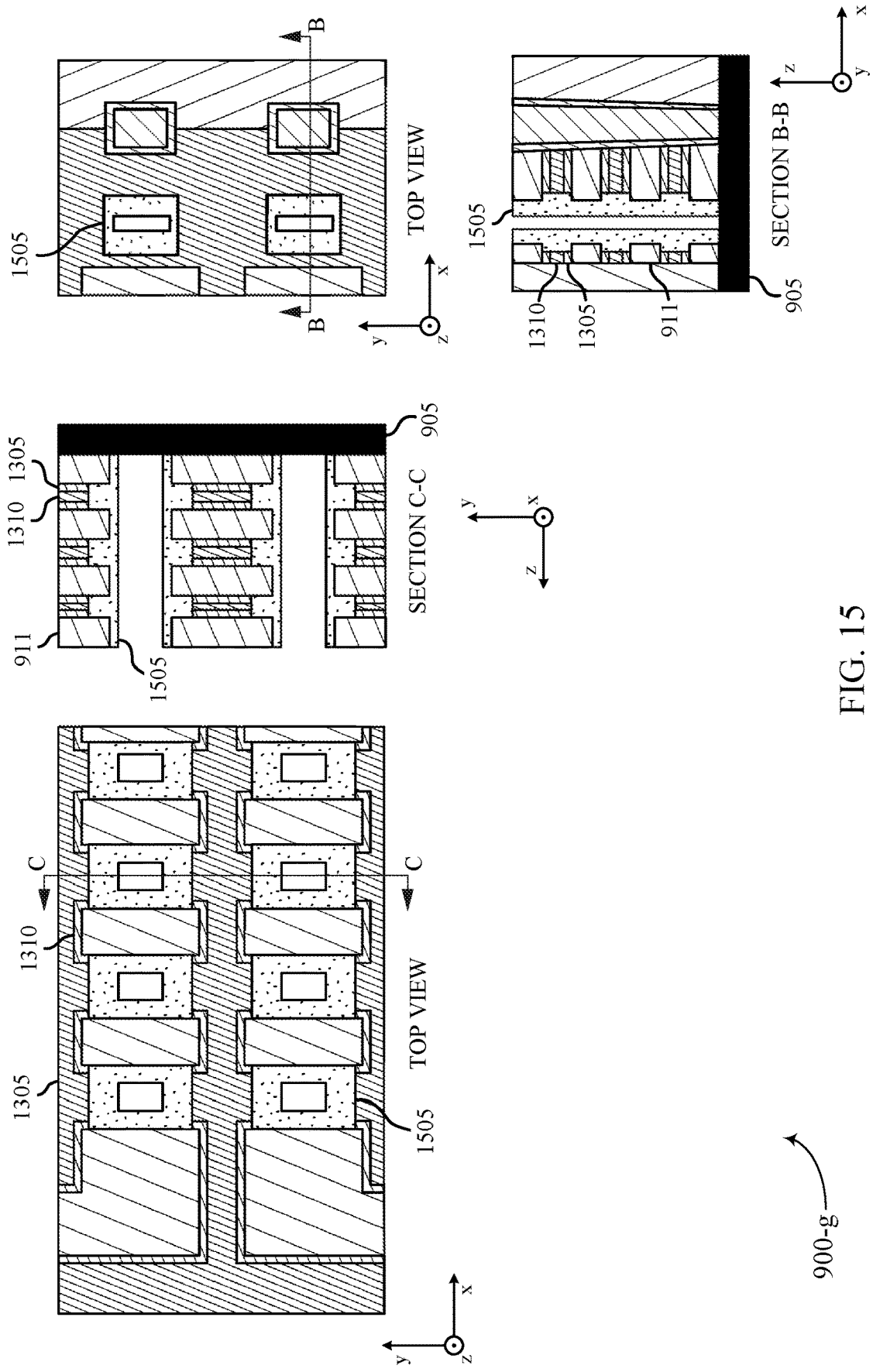

FIG. 15 illustrates a portion 900-g of the layout 900 after a seventh set of one or more manufacturing operations. The seventh set of manufacturing operations may include further operations (e.g., a bottom electrode deposition) that support forming electrodes along the word line members 430, which may be electrodes between the word line members 430 and memory cells 105 of the layout 900. For example, the seventh set of manufacturing operations may include depositing an electrode material 1505 in contact with exposed portions of the first conductive material 1305, the second conductive material 1310, the first material 911, and the substrate 905 in both the memory region 901 and the word line plate region 902. The electrode material 1505 may be an example of a conductive material, and may allow for the flow of current between a storage component of the memory cell and a word line member 430. In some examples, the electrode material 1505 may be in contact with both of the interleaving comb structures 1115. Accordingly, after being deposited, the electrode material 1505 may be in contact with both the word line members 430-a and the word line members 430-b. In some examples, the electrode material 1505 may be a metal or a carbide.

In some examples, the piers 1005 may act as separators for the cavities 1105. For example, because the piers 1005 extend beyond the cavities (e.g., in the y-direction), the piers 1005 may act as a barrier for the electrode material 1505, such that the electrode material 1505 deposited in each cavity 1105 are separated by respective piers 1005.

In some examples, the electrode material 1505 deposited in the word line plate region 902 may be unused for allowing flow through a storage component of a memory cell. For example, a memory cell 105 may not be formed in the word line plate region 902 during subsequent manufacturing operations. However, the electrode material 1505 may be deposited in the word line plate region 902, for example, to simplify the manufacturing process (e.g., avoid additional and different deposition operations), support electrical isolation between the word line plates 420 and pillars subsequently formed in the cavities 1110 (e.g., pillars 445), or both.

Figure 16:
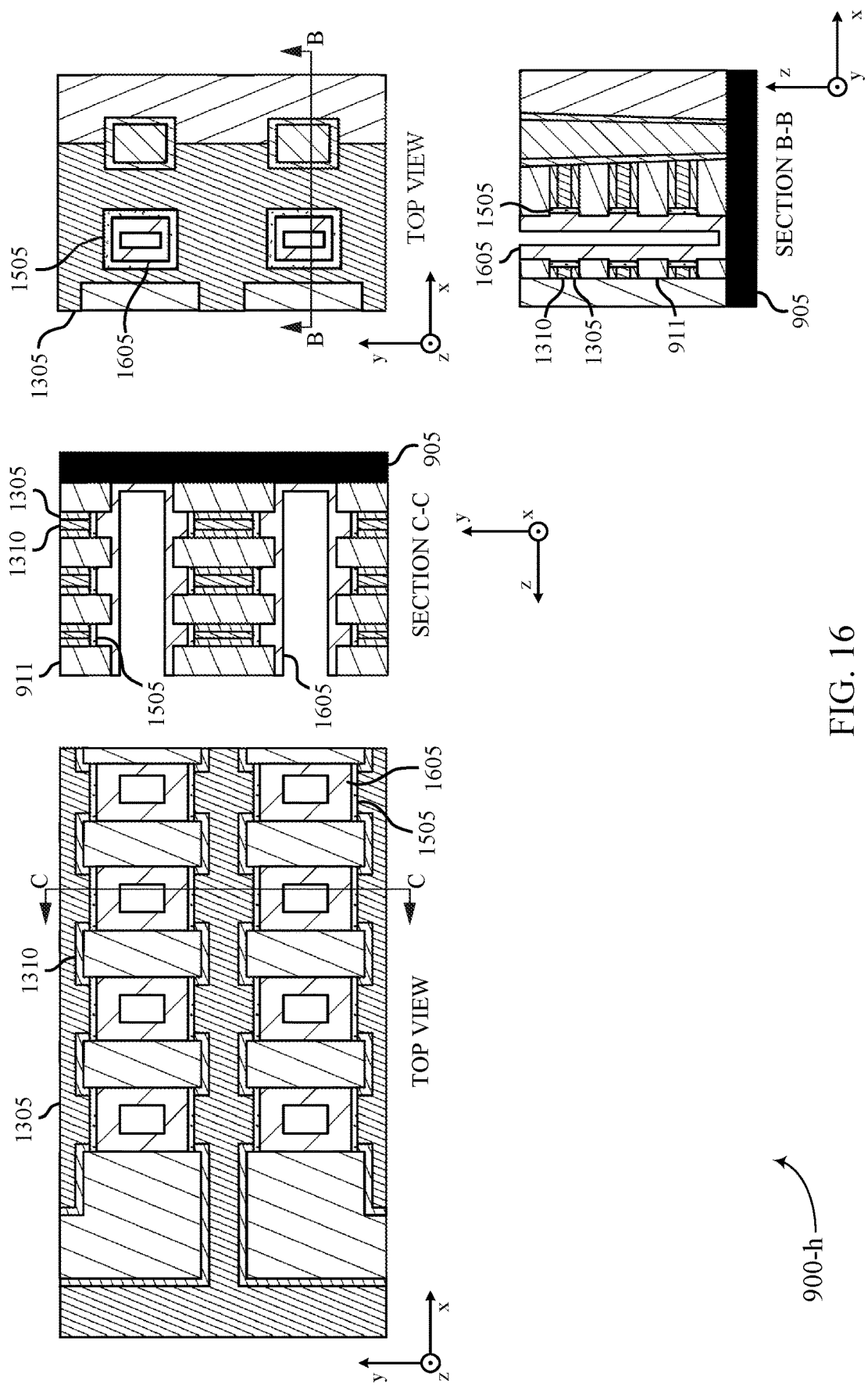

FIG. 16 illustrates a portion 900-h of the layout 900 after an eighth set of one or more manufacturing operations. The eighth set of manufacturing operations may include further operations (e.g., a bottom electrode recess etch operation) that support forming the electrodes along word line members 430. For example, the eighth set of manufacturing operations may include removing (e.g., etching) exposed portions the electrode material 1505, which may recess portions of the electrode material 1505 to be within the voids 1205 and the voids 1210, and which may expose the substrate 905 and at least sidewalls of the first material 911. Such operations may clear the electrode material 1505 from the cavities 1105 and the cavities 1110.

The eighth set of manufacturing operations may also include operations that support forming memory cells 105 in the voids 1205. For example, the eighth set of manufacturing operations may include depositing a placeholder or sacrificial material 1605 in contact with exposed portions of the electrode material 1505, the first material 911, and the substrate 905 in both the memory region 901 and the word line plate region 902. In some examples, the sacrificial material 1605 may be removed from the memory region 901 and replaced with a memory material, such as a chalcogenide material, in later operations. In some examples, the sacrificial material 1605 may remain in the word line plate region 902 in later operations, for example, to support the electrical isolation of the word line plates 420 and pillars subsequently formed in the cavities 1110.

In some examples, the sacrificial material 1605 may be in contact with both of the interleaving comb structures 1115. Accordingly, after being deposited, the sacrificial material 1605 may be in contact with both the word line members 430-*a* and the word line members 430-*b*.

In some examples, the piers 1005 may act as separators for the cavities 1105. For example, because the piers 1005 extend beyond the cavities (e.g., in the y-direction), the piers 1005 may act as a barrier for the sacrificial material 1605, such that the sacrificial material 1605 deposited in each cavity 1105 is separated by respective piers 1005.

Figure 17:
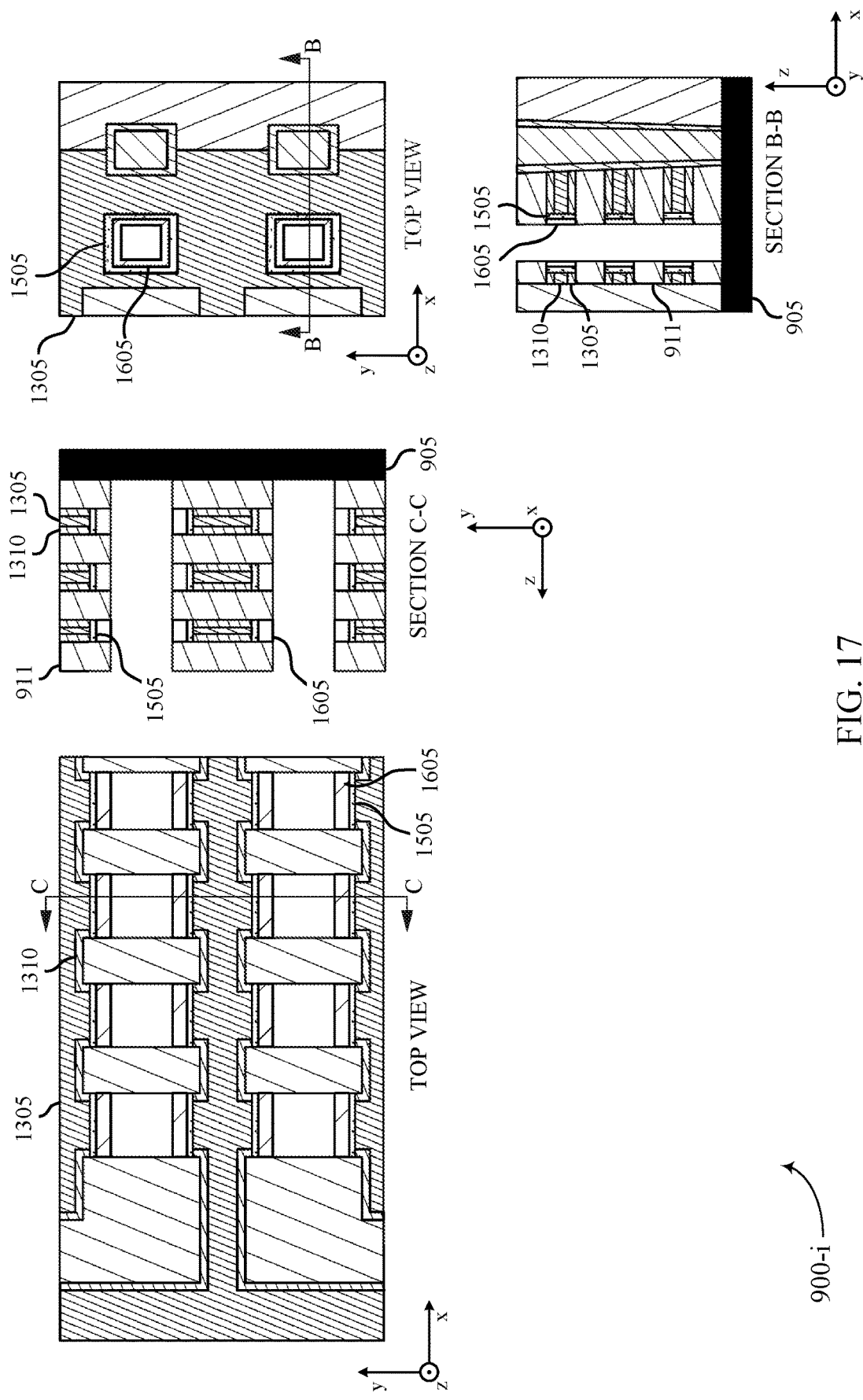

FIG. 17 illustrates a portion 900-*i* of the layout 900 after a ninth set of one or more manufacturing operations. The ninth set of manufacturing operations may include further operations (e.g., a sacrificial material recess etch operation) that support forming the memory cells 105 and electrically isolating the word line plates 420. For example, the ninth set of manufacturing operations may include removing (e.g., etching) exposed portions the sacrificial material 1605, which may recess portions of the sacrificial material 1605 to be within the voids 1205 and the voids 1210, and which may expose the substrate 905 and at least sidewalls of the first material 911. Such operations may clear the sacrificial material 1605 from the cavities 1105 and the cavities 1110.

Figure 18:
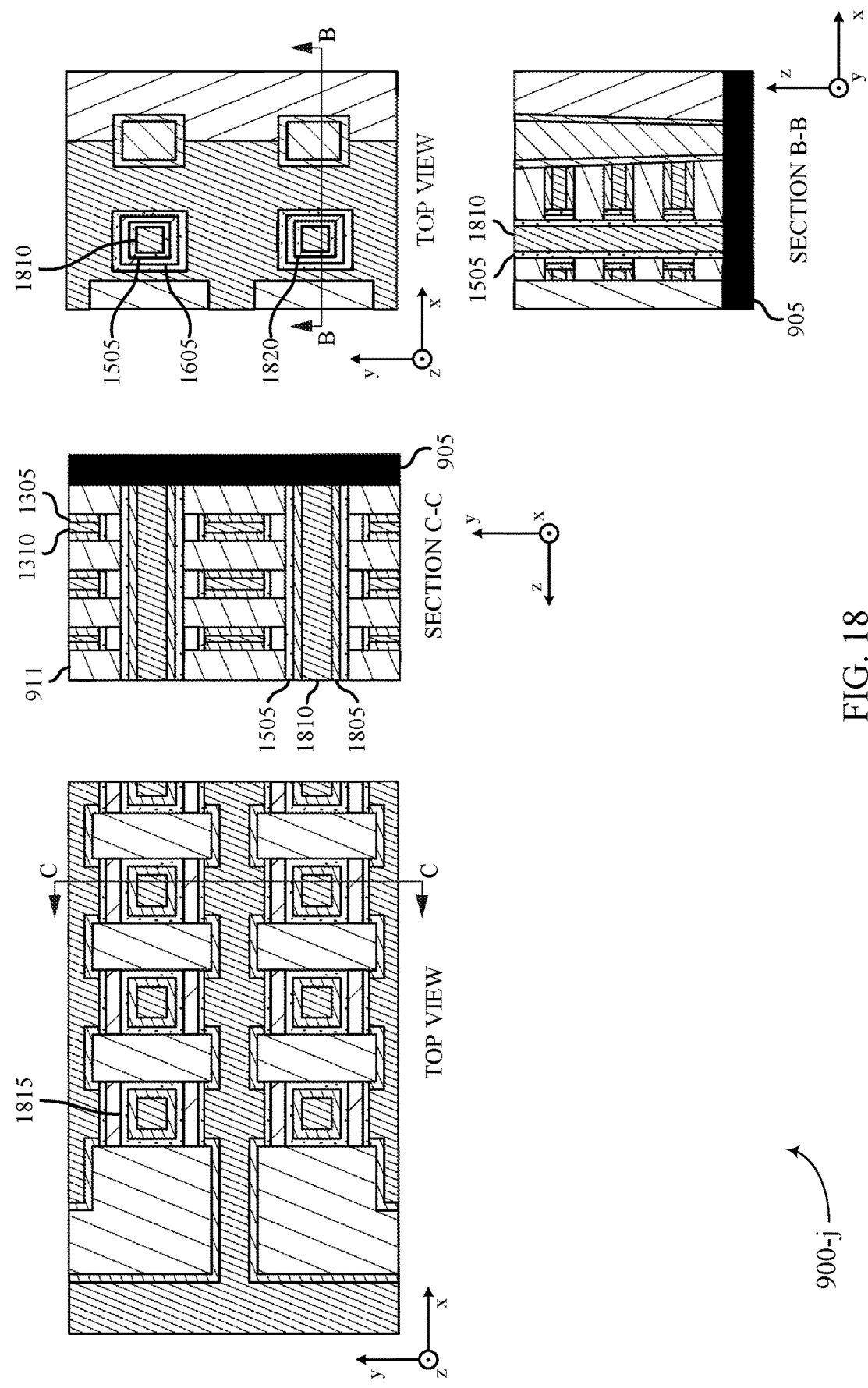

FIG. 18 illustrates a portion 900-*j* of the layout 900 after a tenth set of one or more manufacturing operations. The tenth set of manufacturing operations may include operations (e.g., a gapfill operation) that support forming pillars (e.g., pillars 220, pillars 450) in the set of cavities 1105 and forming pillars (e.g., pillars 445) in the cavities 1110. For example, the tenth set of manufacturing operations may include depositing the electrode material 1505, a ceramic material 1805, and a metallic material 1810 in the set of cavities 1105 of the memory region 901 to form pillars 1815. The tenth set of manufacturing operations may also include depositing the electrode material 1505 and the metallic material 1810 in the set of cavities 1110 of the word line plate region 902 to form pillars 1820. In some examples, the electrode material 1505 may be etched after its deposition and prior to deposition of the ceramic material 1805 and the metallic material 1810 to expose the substrate 905 such that the ceramic material 1805 in the cavities 1105 and the metallic material 1810 in the cavities 1110 may be in contact with the substrate.

In some examples, the ceramic material 1805 may be an example of titanium nitride (TiN), and may act as a barrier between the metallic material 1810 and the other materials. In some examples, the metallic material 1810 may be an example of conductive material, such as tungsten (W), and may form the conductive portion of the pillars 1815 (e.g., the pillars 220, the pillars 450).

In some examples, the pillars 1820 formed in the cavities 1110 may be electrically isolated from the word line plates 420, for example, due to the presence of the sacrificial material 1605 between the metallic material 1810 and the conductive materials 1305 and 1310.

In some cases, the quantity of pillars 1815 formed in the memory region 901 may be equal or substantially equal to the quantity of piers 1005. That is, there may be approximately one pier 1005 per pillar 1815, which may correspond to a dense pier aspect ratio. In some other cases, the quantity of pillars 1815 formed in the memory region 901 may be greater than the quantity of piers 1005. That is, there may be multiple pillars 1815 per pier 1005, which may correspond to a sparse pier aspect ratio.

Figure 19:
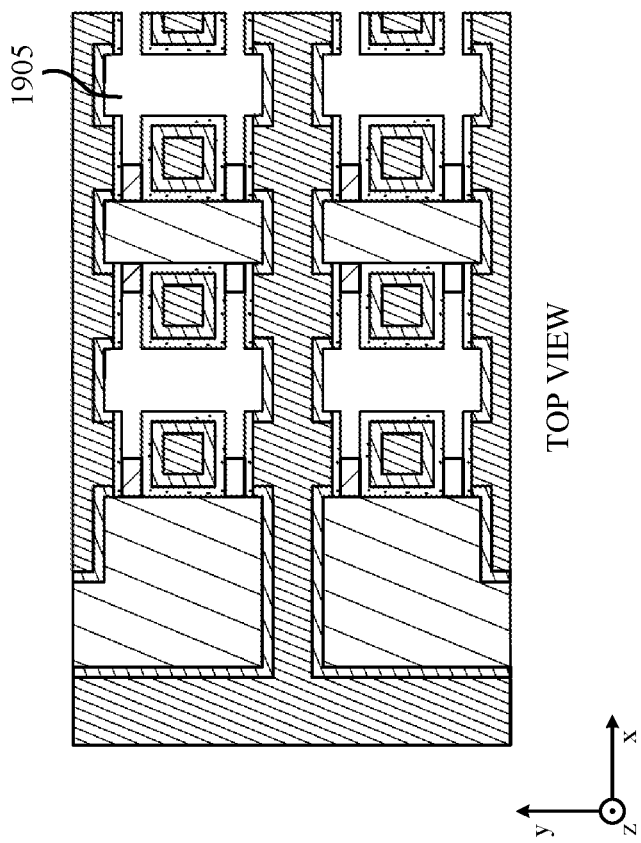

FIG. 19 illustrates a portion 900-*k* of the layout 900 after an eleventh set of one or more manufacturing operations. The eleventh set of manufacturing operations may include further operations (e.g., a recess etch operation) that support forming the memory cells 105. For example, the eleventh set of manufacturing operations may include forming a set of cavities 1905 in the memory region 901. The set of cavities 1905 may be formed by removing (e.g., etching) one or more piers 1005 from the memory region 901 (e.g., using a vertical etch) and removing (e.g., using a lateral recess operation) a portion of the sacrificial material 1605 in the memory region 901 that is exposed based on removing the one or more piers 1005. In some cases, removing the one or more piers 1005 may expose at least one side wall of each pillar 1815, as well as at least one side wall of the electrode material 1505.

Figure 20:
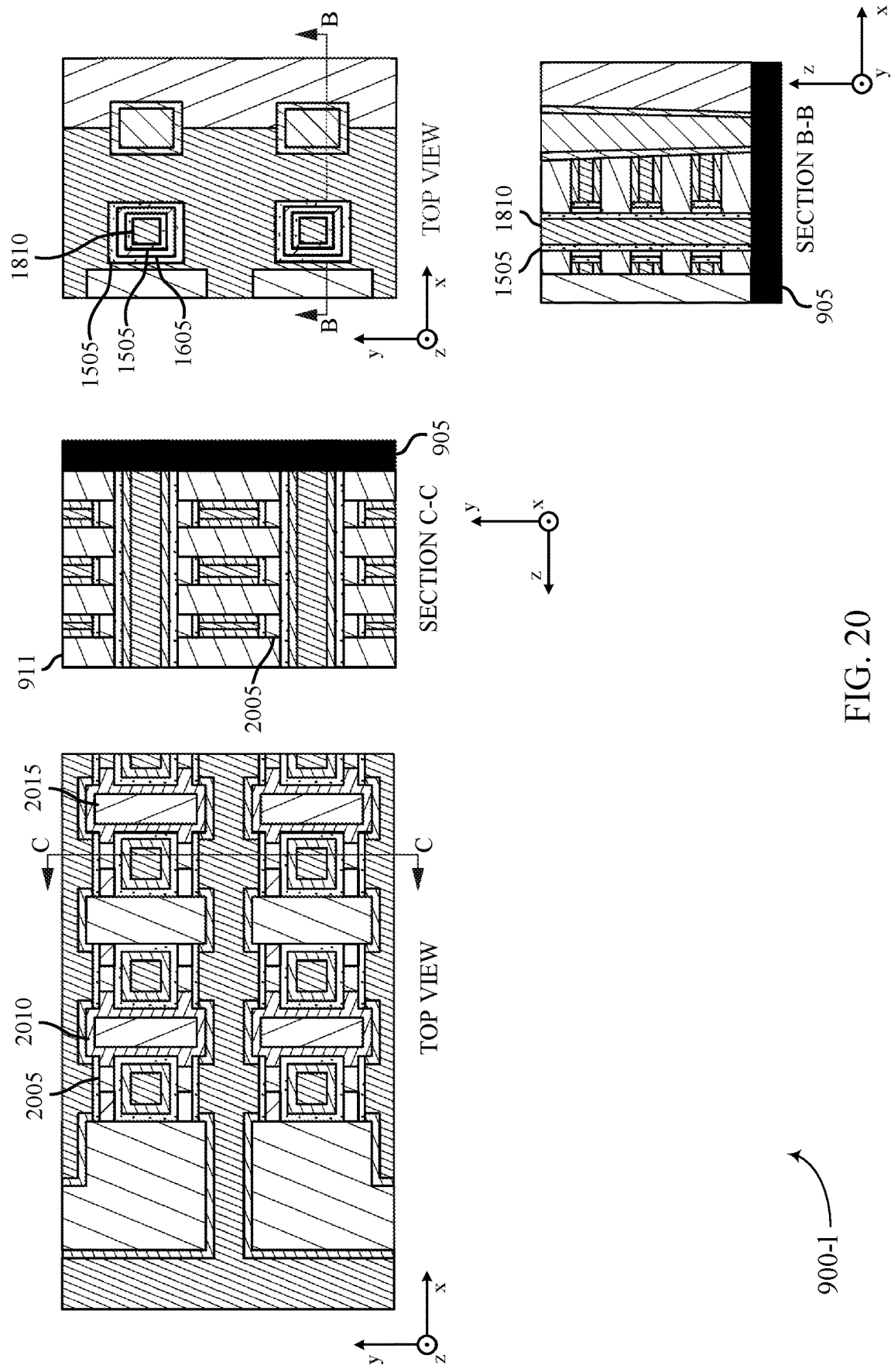

FIG. 20 illustrates a portion 900-1 of the layout 900 after a twelfth set of one or more manufacturing operations. The twelfth set of manufacturing operations may include further operations (e.g., memory cell formation operations) that support forming the memory cells 105. For example, the twelfth set of manufacturing operations may include depositing a storage material in the set of cavities 1905. In some cases, the storage material may be a material configured to store a logic state of a memory cell, such as a chalcogenide glass or a chalcogenide alloy. In some examples, the storage material may initially be deposited to be in contact with both of the interleaving comb structures 1115. Accordingly, after being deposited, the storage material may be in contact with both the word line members 430-*a* and the word line members 430-*b*.

In some examples, prior to depositing the storage material, the twelfth set of manufacturing operations may include pretreating the set of cavities 1905, for example by depositing a sealing layer, such as an ammonia (NH$_3$) layer.

The twelfth set of manufacturing operations may also include a recess or etch of the storage material to form a set of memory cells 2005 in each of the cavities 1905. In some cases, each memory cell 2005 may couple with a pillar 1815 and a word line member 430-*a* or a word line member 430-*b* (e.g., a single layer and tine of a comb structure of the set of interleaved comb structures 1115).

The twelfth set of manufacturing operations may also include depositing a sealing material 2010, which may be an example of a dielectric material, in the set of cavities 1905. In some cases, the sealing material 2010 may be deposited in contact with each memory cell 2005 of each cavity 1905. Additionally, the sealing material 2010 may cover the exposed sidewall of each pillar 1815 (e.g., the sidewall of each pillar 1815 exposed in each cavity 1905). In some examples, the sealing material 2010 may additionally cover the exposed layers of the first material 911 and the ceramic material 1805 (e.g., the portions exposed by the cavities 1905).

The twelfth set of manufacturing operations may also include depositing a gap fill material 2015 in the set of cavities 1905. In some cases, the gap fill material 2015 may be deposited in contact with the sealing material 2010. Additionally, the gap fill material 2015 may fill the remaining portion of each of the cavities 1905. In some cases, the gap fill material 2015 may be an example of a dielectric material, such as a same material as the piers 1005. Alternatively, the gap fill material 2015 may be an example of a different dielectric material.

The sealing material 2010 along with the gap fill material 2015 in each cavity 1905 may form a set of respective dielectric portions. In some cases, forming the set of dielectric portions may further include performing a polishing or a planarization process to smooth or polish the top of the layout 900 (e.g., including the memory region 901 and the word line plate region 902. In some examples, the dielectric portions may have a length in the y-direction which is greater than the length of the cavities 1905. That is, the dielectric portions may extend at least partially into the word line member 430-a and 430-b. Accordingly, the dielectric portions may form a single continuous surface between the word line members 430-a and 430-b.

In some examples, the eleventh and twelfth set of manufacturing operations may be specific to the memory region 901. For example, the word line plates 420 may be formed after the tenth set of manufacturing operations, and the structures of the word line plate region 902 may be unaffected by the eleventh and twelfth set of manufacturing operations. In some examples, the word line plate region 902 may be masked during the eleventh and twelfth set of manufacturing operations such that the operations do not affect the word line plate region 902.

Figure 21:
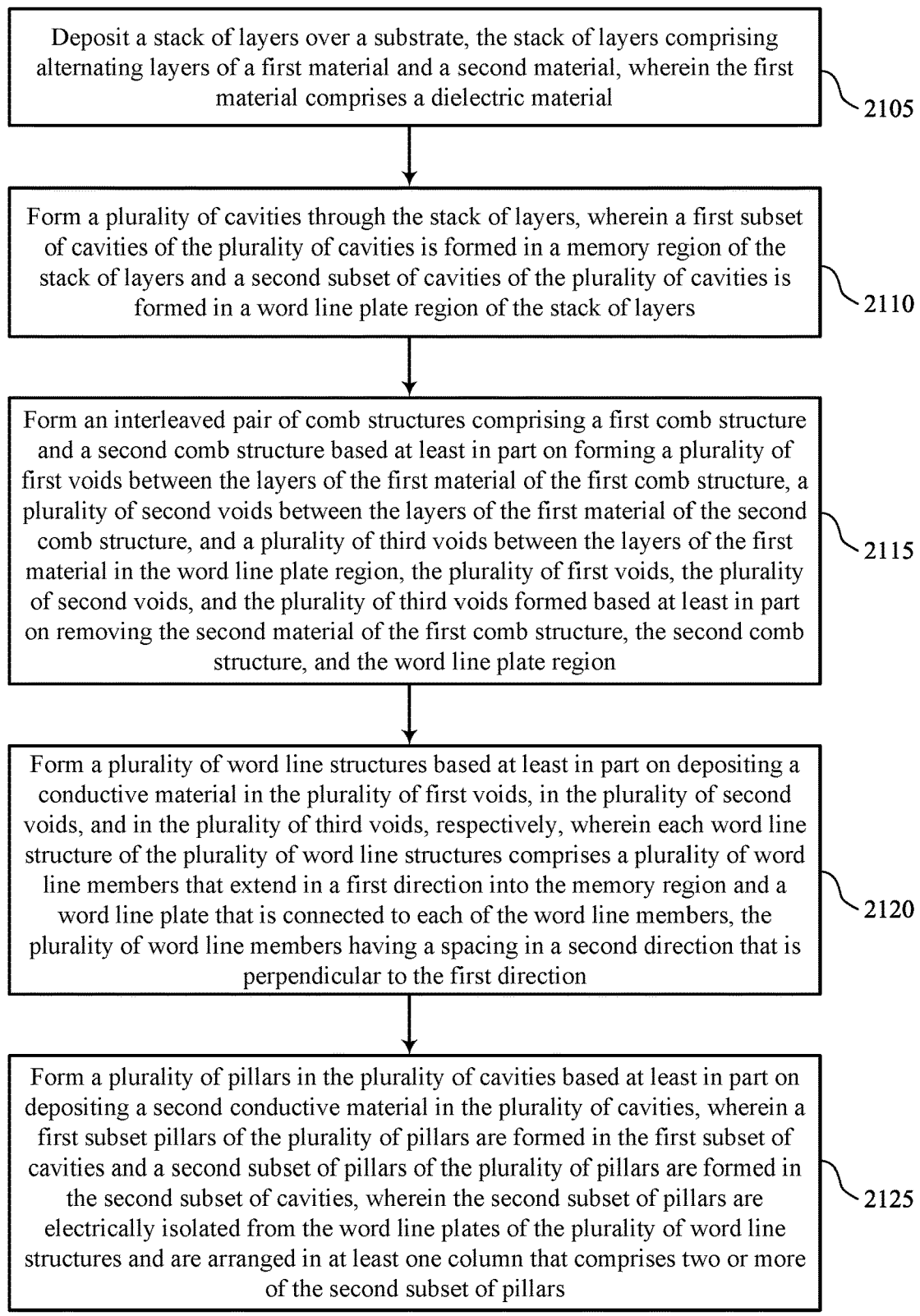
FIG. 21 shows a flowchart illustrating a method or methods that support word line structures for three-dimensional memory arrays in accordance with examples as disclosed herein.

FIG. 21 shows a flowchart illustrating a method 2100 that supports word line structures for three-dimensional memory arrays in accordance with examples as disclosed herein. The operations of method 2100 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 2105, the method may include depositing a stack of layers over a substrate, the stack of layers including alternating layers of a first material and a second material, where the first material includes a dielectric material. The operations of 2105 may be performed in accordance with examples as disclosed herein.

At 2110, the method may include forming a plurality of cavities through the stack of layers, where a first subset of cavities of the plurality of cavities is formed in a memory region of the stack of layers and a second subset of cavities of the plurality of cavities is formed in a word line plate region of the stack of layers. The operations of 2110 may be performed in accordance with examples as disclosed herein.

At 2115, the method may include forming an interleaved pair of comb structures including a first comb structure and a second comb structure based at least in part on forming a plurality of first voids between the layers of the first material of the first comb structure, a plurality of second voids between the layers of the first material of the second comb structure, and a plurality of third voids between the layers of the first material in the word line plate region, the plurality of first voids, the plurality of second voids, and the plurality of third voids formed based at least in part on removing the second material of the first comb structure, the second comb structure, and the word line plate region. The operations of 2115 may be performed in accordance with examples as disclosed herein.

At 2120, the method may include forming a plurality of word line structures based at least in part on depositing a conductive material in the plurality of first voids, in the plurality of second voids, and in the plurality of third voids, respectively, where each word line structure of the plurality of word line structures includes a plurality of word line members that extend in a first direction into the memory region and a word line plate that is connected to each of the word line members, the plurality of word line members having a spacing in a second direction that is perpendicular to the first direction. The operations of 2120 may be performed in accordance with examples as disclosed herein.

At 2125, the method may include forming a plurality of pillars in the plurality of cavities based at least in part on depositing a second conductive material in the plurality of cavities, where a first subset pillars of the plurality of pillars are formed in the first subset of cavities and a second subset of pillars of the plurality of pillars are formed in the second subset of cavities, where the second subset of pillars are electrically isolated from the word line plates of the plurality of word line structures and are arranged in at least one column that includes two or more of the second subset of pillars. The operations of 2125 may be performed in accordance with examples as disclosed herein.

In some examples, an apparatus (e.g., a manufacturing system) as described herein may perform a method or methods, such as the method 2100. The apparatus may include features, circuitry, logic, means, or instructions (e.g., a set of instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for depositing a stack of layers over a substrate, the stack of layers including alternating layers of a first material and a second material, where the first material includes a dielectric material; forming a plurality of cavities through the stack of layers, where a first subset of cavities of the plurality of cavities is formed in a memory region of the stack of layers and a second subset of cavities of the plurality of cavities is formed in a word line plate region of the stack of layers; forming an interleaved pair of comb structures including a first comb structure and a second comb structure based at least in part on forming a plurality of first voids between the layers of the first material of the first comb structure, a plurality of second voids between the layers of the first material of the second comb structure, and a plurality of third voids between the layers of the first material in the word line plate region, the plurality of first voids, the plurality of second voids, and the plurality of third voids formed based at least in part on removing the second material of the first comb structure, the second comb structure, and the word line plate region; forming a plurality of word line structures based at least in part on depositing a conductive material in the plurality of first voids, in the plurality of second voids, and in the plurality of third voids, respectively, where each word line structure of the plurality of word line structures includes a plurality of word line members that extend in a first direction into the memory region and a word line plate that is connected to each of the word line members, the plurality of word line members having a spacing in a second direction that is perpendicular to the first direction; and forming a plurality of pillars in the plurality of cavities based at least in part on depositing a second conductive material in the plurality of cavities, where a first subset pillars of the plurality of pillars are formed in the first subset of cavities and a second subset of pillars of the plurality of pillars are formed in the second subset of cavities, where the second subset of pillars are electrically isolated from the word line plates of the plurality of word line structures and are arranged in at least one column that includes two or more of the second subset of pillars.

Aspect 2: The method or apparatus of aspect 1 where a third subset of cavities of the plurality of cavities is formed in the word line plate region and the method or apparatuses further includes operations, features, circuitry, logic, means, or instructions, or any combination thereof for forming a plurality of vias based at least in part on depositing a third conductive material in the third subset of cavities, where the plurality of vias extend vertically through the word line plates of the plurality of word line structures and are electrically isolated from the plurality of word line structures.

Aspect 3: The method or apparatus of any of aspects 1 through 2 where a fourth subset of cavities of the plurality of cavities is formed in the word line plate region and the method or apparatuses further includes operations, features, circuitry, logic, means, or instructions, or any combination thereof for forming a plurality of vias based at least in part on depositing a fourth conductive material in the fourth subset of cavities, where each via is coupled with a respective contact of a respective word line plate of a respective word line structure and extends from the respective contact vertically through each of the word line plates above the respective word line plate, where a subset of the plurality of vias are arranged in a plurality of rows extending in the first direction and at least one column extending in the second direction, and where a first quantity of vias in each row is less than a second quantity of vias in the at least one column.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 4: An apparatus, including: a plurality of word line decoders; a plurality of word line structures arranged vertically above a substrate, the plurality of word line structures separated from each other by respective dielectric layers, where each word line structure includes: a plurality of word line members that each extend in a first direction and into a memory region; and a word line plate that extends in the first direction and in a second direction orthogonal to the first direction and is connected to each of the word line members, the word line plate including a contact; a plurality of first vias extending vertically through holes in the word line plates of the plurality of word line structures, where each of the plurality of first vias are coupled with a respective word line decoder of the plurality of word line decoders; and a plurality of second vias, where each second via is coupled with a respective contact of a respective word line plate of a respective word line structure and extends from the respective contact vertically through openings in each of the word line plates above the respective word line plate, where a subset of the plurality of second vias are arranged in a plurality of rows extending in the first direction and at least one column extending in the second direction, and where a first quantity of second vias in each row is less than a second quantity of second vias in the at least one column.

Aspect 5: The apparatus of aspect 4, further including: a first plurality of pillars extending vertically through the memory region, where each respective memory cell of a plurality of memory cells in the memory region is coupled between a pillar of the first plurality of pillars and a respective word line member; and a second plurality of pillars extending vertically through the word line plates of the plurality of word line structures, where the second plurality of pillars are arranged in at least one column extending in the second direction that includes two or more of the second plurality of pillars.

Aspect 6: The apparatus of aspect 5, where the second plurality of pillars are electrically isolated from the plurality of word line structures.

Aspect 7: The apparatus of any of aspects 5 through 6, where at least a subset of the second plurality of pillars are coupled with a subset of word line decoders of the plurality of word line decoders.

Aspect 8: The apparatus of aspect 7, where at least the subset of the second plurality of pillars are coupled with at least a second subset of the plurality of second vias.

Aspect 9: The apparatus of any of aspects 4 through 8, where each of the respective word line plates include respective portions that span a distance in the second direction of the at least one column of the subset of the plurality of second vias and are located between respective subsets of the plurality of second vias.

Aspect 10: The apparatus of any of aspects 4 through 9, further including: a plurality of third vias extending vertically through additional holes in the word line plates of the plurality of word line structures, where each of the plurality of third vias are dummy vias.

Aspect 11: The apparatus of aspect 10, where: the plurality of first vias are arranged in rows of first vias extending in the first direction and columns of first vias extending in the second direction, and the plurality of third vias are arranged in rows of third vias extending in the first direction and columns of third vias extending in the second direction, a column of third vias located between each column of first vias.

Aspect 12: The apparatus of aspect 10, where: the plurality of first vias are arranged in rows of first vias extending in the first direction and columns of first vias extending in the second direction, and the plurality of third vias are arranged in rows of third vias extending in the first direction and columns of third vias extending in the second direction, where two columns of first vias are located between each pair of columns of third vias.

Aspect 13: The apparatus of any of aspects 4 through 12, where: a first subset of word line members of the plurality of word line members of each word line structure extend from a first side of the word line plate, and a second subset of word line members of the plurality of word line members of each word line structure extend from a second side of the word line plate that is opposite the first side.

Aspect 14: The apparatus of any of aspects 4 through 13, where: each second via is coupled with a first via of the plurality of first vias, and a respective word line plate is coupled with a respective word line decoder based at least in part on a respective coupling between a respective second via and a respective first via.

Aspect 15: The apparatus of any of aspects 4 through 14, where the word line plates of the plurality of word line structures are formed above the plurality of word line decoders.

Aspect 16: The apparatus of any of aspects 4 through 15, where the plurality of word line members of each word line structure have a spacing in the second direction between each word line member.

Aspect 17: The apparatus of any of aspects 4 through 16, where each word line structure includes a second plurality of word line members that each extend in a third direction and into a second memory region, the third direction opposite to and parallel with the first direction.

An apparatus is described. The following provides an overview of aspects of the apparatus as described herein:

Aspect 18: An apparatus, including: a plurality of memory regions; a plurality of word line structures arranged vertically above a substrate and separated from each other by respective dielectric layers, where each word line structure includes a plurality of word line members that extend in a first direction into a respective memory region of the plurality of memory regions and a word line plate that is connected to each of the word line members, the plurality of word line members having a spacing in a second direction that is orthogonal to the first direction; a first plurality of pillars extending vertically through the plurality of memory regions, where a respective memory cell of a respective memory region is coupled between a pillar of the first plurality of pillars and a respective word line member; and a second plurality of pillars extending vertically through the word line plates of the plurality of word line structures, where the second plurality of pillars are electrically isolated from the plurality of word line structures and are arranged in at least one column that includes two or more of the second plurality of pillars.

Aspect 19: The apparatus of aspect 18, further including: a plurality of vias, where each via is coupled with a respective contact of a respective word line plate of a respective word line structure and extends from the respective contact vertically through openings in each of the word line plates above the respective word line plate, where a subset of the plurality of vias are arranged in a plurality of rows extending in the first direction and at least one column extending in the second direction, and where a first quantity of vias in each row is less than a second quantity of second vias in the at least one column.

Aspect 20: The apparatus of aspect 19, where each of the respective word line plates include respective portions that span a distance in the second direction of the at least one column of the subset of the plurality of vias and are located between respective subsets of the plurality of vias.

Aspect 21: The apparatus of any of aspects 18 through 20, further including: a plurality of word line decoders; and a plurality of first vias extending vertically through holes in the word line plates of the plurality of word line structures, where each of the plurality of first vias are coupled with a respective word line decoder of the plurality of word line decoders.

Aspect 22: The apparatus of aspect 21, further including: a plurality of second vias extending vertically through additional holes in the word line plates of the plurality of word line structures, where each of the plurality of second vias are dummy vias.

Aspect 23: The apparatus of aspect 22, where: the plurality of first vias are arranged in rows of first vias extending in the first direction and columns of first vias extending in the second direction, and the plurality of second vias are arranged in rows of second vias extending in the first direction and columns of second vias extending in the second direction, a column of second vias located between each column of first vias.

Aspect 24: The apparatus of aspect 22, where: the plurality of first vias are arranged in rows of first vias extending in the first direction and columns of first vias extending in the second direction, and the plurality of second vias are arranged in rows of second vias extending in the first direction and columns of second vias extending in the second direction, where two columns of first vias are located between each pair of columns of second vias.

Aspect 25: The apparatus of any of aspects 18 through 24, where the word line plate of each word line structure extends in the first direction and the second direction orthogonal to the first direction.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a plurality of word line decoders;
a plurality of word line structures arranged above a substrate, the plurality of word line structures separated from each other by respective dielectric layers, wherein each word line structure comprises:
a plurality of word line members that each extend in a first direction and into a memory region; and
a word line plate that extends in the first direction and in a second direction orthogonal to the first direction and is connected to each of the word line members, the word line plate comprising a contact;
a plurality of first vias extending vertically through holes in the word line plates of the plurality of word line structures, wherein each of the plurality of first vias are coupled with a respective word line decoder of the plurality of word line decoders; and
a plurality of second vias, wherein each second via is coupled with a respective contact of a respective word line plate of a respective word line structure and extends from the respective contact vertically through openings in each of the word line plates above the respective word line plate, wherein a subset of the plurality of second vias are arranged in a plurality of rows extending in the first direction and at least one column extending in the second direction, and wherein a first quantity of second vias in each row is less than a second quantity of second vias in the at least one column.

2. The apparatus of claim 1, further comprising:
a first plurality of pillars extending vertically through the memory region, wherein each respective memory cell of a plurality of memory cells in the memory region is coupled between a pillar of the first plurality of pillars and a respective word line member; and
a second plurality of pillars extending vertically through the word line plates of the plurality of word line structures, wherein the second plurality of pillars are arranged in at least one column extending in the second direction that comprises two or more of the second plurality of pillars.

3. The apparatus of claim 2, wherein the second plurality of pillars are electrically isolated from the plurality of word line structures.

4. The apparatus of claim 2, wherein at least a subset of the second plurality of pillars are coupled with a subset of word line decoders of the plurality of word line decoders.

5. The apparatus of claim 4, wherein at least the subset of the second plurality of pillars are coupled with at least a second subset of the plurality of second vias.

6. The apparatus of claim 1, wherein each of the respective word line plates comprise respective portions that span a distance in the second direction of the at least one column of the subset of the plurality of second vias and are located between respective subsets of the plurality of second vias.

7. The apparatus of claim 1, further comprising:
a plurality of third vias extending vertically through additional holes in the word line plates of the plurality of word line structures, wherein each of the plurality of third vias are dummy vias.

8. The apparatus of claim 7, wherein:
the plurality of first vias are arranged in rows of first vias extending in the first direction and columns of first vias extending in the second direction, and
the plurality of third vias are arranged in rows of third vias extending in the first direction and columns of third vias extending in the second direction, a column of third vias located between each column of first vias.

9. The apparatus of claim 7, wherein:
the plurality of first vias are arranged in rows of first vias extending in the first direction and columns of first vias extending in the second direction, and
the plurality of third vias are arranged in rows of third vias extending in the first direction and columns of third vias extending in the second direction, wherein two columns of first vias are located between each pair of columns of third vias.

10. The apparatus of claim 1, wherein:
a first subset of word line members of the plurality of word line members of each word line structure extend from a first side of the word line plate, and
a second subset of word line members of the plurality of word line members of each word line structure extend from a second side of the word line plate that is opposite the first side.

11. The apparatus of claim 1, wherein:
each second via is coupled with a first via of the plurality of first vias, and
a respective word line plate is coupled with a respective word line decoder based at least in part on a respective coupling between a respective second via and a respective first via.

12. The apparatus of claim 1, wherein the word line plates of the plurality of word line structures are formed above the plurality of word line decoders.

13. The apparatus of claim 1, wherein the plurality of word line members of each word line structure have a spacing in the second direction between each word line member.

14. The apparatus of claim 1, wherein each word line structure comprises a second plurality of word line members that each extend in a third direction and into a second memory region, the third direction opposite to and parallel with the first direction.

15. An apparatus, comprising:
a plurality of memory regions;
a plurality of word line structures arranged above a substrate and separated from each other by respective dielectric layers, wherein each word line structure comprises a plurality of word line members that extend in a first direction into a respective memory region of the plurality of memory regions and a word line plate that is connected to each of the word line members, the plurality of word line members having a spacing in a second direction that is orthogonal to the first direction;
a first plurality of pillars extending vertically through the plurality of memory regions, wherein a respective memory cell of a respective memory region is coupled between a pillar of the first plurality of pillars and a respective word line member; and
a second plurality of pillars extending vertically through the word line plates of the plurality of word line structures, wherein the second plurality of pillars are electrically isolated from the plurality of word line structures and are arranged in at least one column that comprises two or more of the second plurality of pillars.

16. The apparatus of claim 15, further comprising:
a plurality of vias, wherein each via is coupled with a respective contact of a respective word line plate of a respective word line structure and extends from the respective contact vertically through openings in each of the word line plates above the respective word line plate, wherein a subset of the plurality of vias are arranged in a plurality of rows extending in the first direction and at least one column extending in the second direction, and wherein a first quantity of vias in each row is less than a second quantity of second vias in the at least one column.

17. The apparatus of claim 16, wherein each of the respective word line plates comprise respective portions that span a distance in the second direction of the at least one column of the subset of the plurality of vias and are located between respective subsets of the plurality of vias.

18. The apparatus of claim 15, further comprising:
a plurality of word line decoders; and
a plurality of first vias extending vertically through holes in the word line plates of the plurality of word line structures, wherein each of the plurality of first vias are coupled with a respective word line decoder of the plurality of word line decoders.

19. The apparatus of claim 18, further comprising:
a plurality of second vias extending vertically through additional holes in the word line plates of the plurality of word line structures, wherein each of the plurality of second vias are dummy vias.

20. The apparatus of claim 19, wherein:
the plurality of first vias are arranged in rows of first vias extending in the first direction and columns of first vias extending in the second direction, and
the plurality of second vias are arranged in rows of second vias extending in the first direction and columns of second vias extending in the second direction, a column of second vias located between each column of first vias.

21. The apparatus of claim 19, wherein:
the plurality of first vias are arranged in rows of first vias extending in the first direction and columns of first vias extending in the second direction, and
the plurality of second vias are arranged in rows of second vias extending in the first direction and columns of second vias extending in the second direction, wherein two columns of first vias are located between each pair of columns of second vias.

22. The apparatus of claim 15, wherein the word line plate of each word line structure extends in the first direction and the second direction orthogonal to the first direction.

23. A method, comprising:
depositing a stack of layers over a substrate, the stack of layers comprising alternating layers of a first material and a second material, wherein the first material comprises a dielectric material;
forming a plurality of cavities through the stack of layers, wherein a first subset of cavities of the plurality of cavities is formed in a memory region of the stack of layers and a second subset of cavities of the plurality of cavities is formed in a word line plate region of the stack of layers;
forming an interleaved pair of comb structures comprising a first comb structure and a second comb structure based at least in part on forming a plurality of first voids between the layers of the first material of the first comb structure, a plurality of second voids between the layers of the first material of the second comb structure, and a plurality of third voids between the layers of the first material in the word line plate region, the plurality of first voids, the plurality of second voids, and the plurality of third voids formed based at least in part on removing the second material of the first comb structure, the second comb structure, and the word line plate region;
forming a plurality of word line structures based at least in part on depositing a conductive material in the plurality of first voids, in the plurality of second voids, and in the plurality of third voids, respectively, wherein each word line structure of the plurality of word line structures comprises a plurality of word line members that extend in a first direction into the memory region and a word line plate that is connected to each of the word line members, the plurality of word line members having a spacing in a second direction that is perpendicular to the first direction; and
forming a plurality of pillars in the plurality of cavities based at least in part on depositing a second conductive material in the plurality of cavities, wherein a first subset pillars of the plurality of pillars are formed in the first subset of cavities and a second subset of pillars of the plurality of pillars are formed in the second subset of cavities, wherein the second subset of pillars are electrically isolated from the word line plates of the plurality of word line structures and are arranged in at least one column that comprises two or more of the second subset of pillars.

24. The method of claim 23, wherein a third subset of cavities of the plurality of cavities is formed in the word line plate region, the method further comprising:
forming a plurality of vias based at least in part on depositing a third conductive material in the third subset of cavities, wherein the plurality of vias extend vertically through the word line plates of the plurality of word line structures and are electrically isolated from the plurality of word line structures.

25. The method of claim 23, wherein a third subset of cavities of the plurality of cavities is formed in the word line plate region, the method further comprising:
forming a plurality of vias based at least in part on depositing a third conductive material in the third subset of cavities, wherein each via is coupled with a respective contact of a respective word line plate of a respective word line structure and extends from the respective contact vertically through each of the word line plates above the respective word line plate, wherein a subset of the plurality of vias are arranged in a plurality of rows extending in the first direction and at least one column extending in the second direction, and wherein a first quantity of vias in each row is less than a second quantity of vias in the at least one column.

* * * * *